United States Patent
Matsko et al.

(10) Patent No.: US 8,659,814 B2
(45) Date of Patent: Feb. 25, 2014

(54) PARAMETRIC REGENERATIVE OSCILLATORS BASED ON OPTO-ELECTRONIC FEEDBACK AND OPTICAL REGENERATION VIA NONLINEAR OPTICAL MIXING IN WHISPERING GALLERY MODE OPTICAL RESONATORS

(75) Inventors: Andrey B. Matsko, Pasadena, CA (US); Lute Maleki, Pasadena, CA (US)

(73) Assignee: OEwaves, Inc., Pasadena, CA (US)

(*) Notice: Subject to any disclaimer, the term of this patent is extended or adjusted under 35 U.S.C. 154(b) by 45 days.

(21) Appl. No.: 13/532,698

(22) Filed: Jun. 25, 2012

(65) Prior Publication Data

US 2012/0327497 A1 Dec. 27, 2012

Related U.S. Application Data

(60) Provisional application No. 61/500,542, filed on Jun. 23, 2011.

(51) Int. Cl.
*G02B 26/00* (2006.01)
*G02F 1/01* (2006.01)

(52) U.S. Cl.
CPC ............. *G02F 1/0123* (2013.01); *Y10S 359/90* (2013.01)
USPC ........................................ 359/239; 359/900

(58) Field of Classification Search
USPC .................................................. 359/239, 900
See application file for complete search history.

(56) References Cited

U.S. PATENT DOCUMENTS

| | | | |
|---|---|---|---|
| 5,204,640 | A | 4/1993 | Logan, Jr. |
| 5,220,292 | A | 6/1993 | Bianchini et al. |
| 5,723,856 | A | 3/1998 | Yao et al. |
| 5,751,747 | A | 5/1998 | Lutes et al. |
| 5,777,778 | A | 7/1998 | Yao |
| 5,917,179 | A | 6/1999 | Yao |
| 5,929,430 | A | 7/1999 | Yao et al. |
| 5,985,166 | A | 11/1999 | Unger et al. |
| 6,080,586 | A | 6/2000 | Baldeschwieler et al. |
| 6,178,036 | B1 | 1/2001 | Yao |
| 6,203,660 | B1 | 3/2001 | Unger et al. |
| 6,389,197 | B1 | 5/2002 | Iltchenko et al. |
| 6,417,957 | B1 | 7/2002 | Yao |
| 6,473,218 | B1 | 10/2002 | Maleki et al. |
| 6,476,959 | B2 | 11/2002 | Yao |
| 6,487,233 | B2 | 11/2002 | Maleki et al. |
| 6,488,861 | B2 | 12/2002 | Iltchenko et al. |
| 6,490,039 | B2 | 12/2002 | Maleki et al. |

(Continued)

FOREIGN PATENT DOCUMENTS

WO WO-01/96936 A1 12/2001
WO WO-2005/038513 A2 4/2005

(Continued)

OTHER PUBLICATIONS

Braginsky, V.B., et al., "Quality-Factor and Nonlinear Properties of Optical Whispering-Gallery Modes," *Physics Letters A*, 137(7, 8):393-397, May 1989.

(Continued)

*Primary Examiner* — Jack Dinh
(74) *Attorney, Agent, or Firm* — Perkins Coie LLP

(57) ABSTRACT

Techniques and devices based on optical resonators made of nonlinear optical materials and nonlinear wave mixing to generate RF or microwave oscillations using an active opto-electronic loop.

19 Claims, 9 Drawing Sheets

(56) References Cited

U.S. PATENT DOCUMENTS

| | | |
|---|---|---|
| 6,535,328 B2 | 3/2003 | Yao |
| 6,567,436 B1 | 5/2003 | Yao et al. |
| 6,580,532 B1 | 6/2003 | Yao et al. |
| 6,594,061 B2 | 7/2003 | Huang et al. |
| 6,762,869 B2 | 7/2004 | Maleki et al. |
| 6,795,481 B2 | 9/2004 | Maleki et al. |
| 6,798,947 B2 | 9/2004 | Iltchenko |
| 6,853,479 B1 | 2/2005 | Ilchenko et al. |
| 6,871,025 B2 | 3/2005 | Maleki et al. |
| 6,873,631 B2 | 3/2005 | Yao et al. |
| 6,879,752 B1 | 4/2005 | Ilchenko et al. |
| 6,901,189 B1 | 5/2005 | Savchenkov et al. |
| 6,906,309 B2 | 6/2005 | Sayyah et al. |
| 6,922,497 B1 | 7/2005 | Savchenkov et al. |
| 6,928,091 B1 | 8/2005 | Maleki et al. |
| 6,943,934 B1 | 9/2005 | Ilchenko et al. |
| 6,987,914 B2 | 1/2006 | Savchenkov et al. |
| 7,024,069 B2 | 4/2006 | Savchenkov et al. |
| 7,043,117 B2 | 5/2006 | Matsko et al. |
| 7,050,212 B2 | 5/2006 | Matsko et al. |
| 7,061,335 B2 | 6/2006 | Maleki et al. |
| 7,062,131 B2 | 6/2006 | Ilchenko |
| 7,092,591 B2 | 8/2006 | Savchenkov et al. |
| 7,133,180 B2 | 11/2006 | Ilchenko et al. |
| 7,173,749 B2 | 2/2007 | Maleki et al. |
| 7,184,451 B2 | 2/2007 | Ilchenko et al. |
| 7,187,870 B2 | 3/2007 | Ilchenko et al. |
| 7,218,662 B1 | 5/2007 | Ilchenko et al. |
| 7,248,763 B1 | 7/2007 | Kossakovski et al. |
| 7,260,279 B2 | 8/2007 | Gunn et al. |
| 7,283,707 B1 | 10/2007 | Maleki et al. |
| 7,356,214 B2 | 4/2008 | Ilchenko |
| 7,362,927 B1 | 4/2008 | Ilchenko et al. |
| 7,369,722 B2 | 5/2008 | Yilmaz et al. |
| 7,389,053 B1 | 6/2008 | Ilchenko et al. |
| 7,400,796 B1 | 7/2008 | Kossakovski et al. |
| 7,440,651 B1 | 10/2008 | Savchenkov et al. |
| 7,460,746 B2 | 12/2008 | Maleki et al. |
| 7,480,425 B2 | 1/2009 | Gunn et al. |
| 7,587,144 B2 | 9/2009 | Ilchenko et al. |
| 7,630,417 B1 | 12/2009 | Maleki et al. |
| 7,634,201 B2 | 12/2009 | Maleki et al. |
| 7,801,189 B2 | 9/2010 | Maleki et al. |
| 7,813,651 B2 | 10/2010 | Ilchenko et al. |
| 7,869,472 B2 | 1/2011 | Maleki et al. |
| 7,929,589 B1 | 4/2011 | Ilchenko et al. |
| 7,965,745 B2 | 6/2011 | Maleki et al. |
| 7,991,025 B2 | 8/2011 | Maleki et al. |
| 8,089,684 B1 | 1/2012 | Koonath et al. |
| 8,094,359 B1 | 1/2012 | Matsko et al. |
| 8,102,597 B1 | 1/2012 | Maleki et al. |
| 8,111,722 B1 | 2/2012 | Maleki et al. |
| 8,155,913 B2 | 4/2012 | Eliyahu et al. |
| 8,155,914 B2 | 4/2012 | Eliyahu et al. |
| 8,159,736 B2 | 4/2012 | Maleki et al. |
| 2001/0038651 A1 | 11/2001 | Maleki et al. |
| 2002/0018611 A1 | 2/2002 | Maleki et al. |
| 2002/0018617 A1 | 2/2002 | Iltchenko et al. |
| 2002/0021765 A1 | 2/2002 | Maleki et al. |
| 2002/0081055 A1 | 6/2002 | Painter et al. |
| 2002/0085266 A1 | 7/2002 | Yao |
| 2002/0097401 A1 | 7/2002 | Maleki et al. |
| 2003/0160148 A1 | 8/2003 | Yao et al. |
| 2004/0100675 A1 | 5/2004 | Matsko et al. |
| 2004/0109217 A1 | 6/2004 | Maleki et al. |
| 2004/0218880 A1 | 11/2004 | Matsko et al. |
| 2004/0240781 A1 | 12/2004 | Savchenkov et al. |
| 2005/0017816 A1 | 1/2005 | Ilchenko et al. |
| 2005/0063034 A1 | 3/2005 | Maleki et al. |
| 2005/0074200 A1 | 4/2005 | Savchenkov et al. |
| 2005/0123306 A1 | 6/2005 | Ilchenko et al. |
| 2005/0128566 A1 | 6/2005 | Savchenkov et al. |
| 2005/0175358 A1 | 8/2005 | Ilchenko et al. |
| 2005/0248823 A1 | 11/2005 | Maleki et al. |
| 2007/0009205 A1 | 1/2007 | Maleki et al. |
| 2007/0153289 A1 | 7/2007 | Yilmaz et al. |
| 2008/0001062 A1 | 1/2008 | Gunn et al. |
| 2008/0075464 A1 | 3/2008 | Maleki et al. |
| 2008/0310463 A1 | 12/2008 | Maleki et al. |
| 2009/0097516 A1 | 4/2009 | Maleki et al. |
| 2009/0135860 A1 | 5/2009 | Maleki et al. |
| 2009/0208205 A1 | 8/2009 | Eliyahu et al. |
| 2009/0251705 A1 | 10/2009 | Le et al. |
| 2009/0310629 A1 | 12/2009 | Maleki et al. |
| 2009/0324251 A1 | 12/2009 | Ilchenko et al. |
| 2011/0110387 A1 | 5/2011 | Maleki et al. |
| 2011/0150485 A1 | 6/2011 | Seidel et al. |
| 2011/0255094 A1 | 10/2011 | Mohageg et al. |
| 2012/0039346 A1 | 2/2012 | Liang et al. |

FOREIGN PATENT DOCUMENTS

| | | |
|---|---|---|
| WO | WO-2005/055412 A2 | 6/2005 |
| WO | WO-2005/067690 A2 | 7/2005 |
| WO | WO-2005/122346 A2 | 12/2005 |
| WO | WO-2006/076585 A2 | 7/2006 |
| WO | WO-2007/143627 A2 | 12/2007 |

OTHER PUBLICATIONS

Eliyahu, D., et al., "Low Phase Noise and Spurious Levels in Multi-Loop Opto-Electronic Oscillators," *Proceedings of the 2003 IEEE International Frequency Control Sympsoium and PDA Exhibition*, pp. 405-410, May 2003.

Eliyahu, D., et al., "Modulation Response ($S_{21}$) of the Coupled Opto-Electronic Oscillator," *Proceedings of the 2005 IEEE International Frequency Control Symposium and Exposition*, pp. 850-856, Aug. 2005.

Eliyahu, D., et al., "Tunable, Ultra-Low Phase Noise YIG Based Opto-Electronic Oscillator," *IEEE MTT-S International Microwave Symposium Digest*, 3:2185-2187, Jun. 2003.

Gorodetsky, M.L., et al., "Optical Microsphere Resonators: Optimal Coupling to High-$Q$ Whispering-Gallery Modes," *J.Opt. Soc. Am. B*, 16(1):147-154, Jan. 1999.

Gorodetsky, M.L., et al., "Rayleigh Scattering in High-$Q$ Microspheres," *J. Opt. Soc. Am. B*, 17(6):1051-1057, Jun. 2000.

Gorodetsky, M.L., et al., "Ultimate $Q$ of Optical Microsphere Resonators," *Optics Letters*, 21(7):453-455, Apr. 1996.

Hryniewicz, J.V., et al., "Higher Order Filter Response in Coupled Microring Resonators," *IEEE Photonics Technology Letters*, 12(3):320-322, Mar. 2000.

Huang, S., et al., "A 'Turnkey' Optoelectronic Oscillator with Low Acceleration Sensitivity," *2000 IEEE/EIA International Frequency Control Symposium and Exhibition*, pp. 269-279, Jun. 2000.

Ilchenko, V., et al., "Electrooptically Tunable Photonic Microresonators and Photonic Bandgap Waveguide Coupling for Micro-Optoelectronic Oscillators," *GOMACTech 2003*, Tampa, Florida, pp. 1-4.

Ilchenko, V., et al., "High-Q Microsphere Cavity for Laser Stabilization and Optoelectronic Microwave Oscillator," *Proceedings SPIE Microresonators and Whispering-Gallery Modes*, vol. 3611, pp. 190-198, Jan. 1999.

Ilchenko, V., et al., "Microsphere Integration in Active and Passive Photonics Devices," *Proc. of SPIE Laser Resonators III*, vol. 3930, pp. 154-162, Jan. 2000.

Ilchenko, V., et al., "Microtorus: A High-Finesse Microcavity with Whispering-Gallery Modes," *Optics Letters*, 26(5):256-258, Mar. 2001.

Ilchenko, V., et al., "Pigtailing the High-$Q$ Microsphere Cavity: A Simple Fiber Coupler for Optical Whispering-Gallery Modes," *Optics Letters*, 24(11):723-725, Jun. 1999.

Ilchenko, V., et al., "Sub-Micro Watt Photonic Microwave Receiver," *IEEE Photonics Technology Letters*, 14(11):1602-1604, Nov. 2002.

Ilchenko, V., et al., "Tunability and Synthetic Lineshapes in High-Q Optical Whispering Gallery Modes," *Proc. of SPIE Laser Resonators and Beam Control VI*, vol. 4969, pp. 195-206, Jan. 2003.

Ilchenko, V., et al., "Whispering-Gallery-Mode Electro-Optic Modulator and Photonic Microwave Receiver," *J. Opt. Soc. Am. B*, 20(2):333-342, Feb. 2003.

(56) References Cited

OTHER PUBLICATIONS

Ito, H., et al., "InP/InGaAs Uni-Travelling-Carrier Photodiode with 310 GHz Bandwidth," *Electronics Letters*, 36(21):1809-1810, Oct. 2000.

Logan, R., et al., "Stabilization of Oscillator Phase Using a Fiber-Optic Delay-Line," *IEEE 45th Annual Symposium on Frequency Control*, pp. 508-512, May 1991.

Maleki, L., "The Opto-Electronic Oscillator: Prospects for Extending the State of the Art in Reference Frequency Generation," *International Topical Meeting on Microwave Photonics*, pp. 195-198, Oct. 1998.

Matsko, A., et al., "Active Mode Locking with Whispering-Gallery Modes," *J. Opt. Soc. Am. B*, 20(11):2292-2296, Nov. 2003.

Matsko, A., et al., "Whispering-Gallery-Mode based Optoelectronic Microwave Oscillator," *Journal of Modern Optics*, 50(15-17):2523-2542, Feb. 2004.

Matsko, A., et al., "Whispering-Gallery-Mode Resonators as Frequency References. I. Fundamental Limitations," *J. Opt. Soc. Am. B*, 24(6):1324-1335, Jun. 2007.

Myers, L.E., et al., "Quasi-Phase-Matched Optical Parametric Oscillators in Bulk Periodically Poled $LiNbO_3$," *J. Opt. Soc. Am. B*, 12(11):2102-2116, Nov. 1995.

Savchenkov, A., et al., "RF photonic signal processing components: From high order tunable filters to high stability tunable oscillators," *IEEE Radar Conference*, pp. 1-6, May 2009.

Savchenkov, A., et al., "Tunable Resonant Single-Sideband Electro-Optical Modulator," *Digest of the IEEE/LEOS Summer Topical Meetings*, pp. 63-64, Jul. 2009.

Savchenkov, A., et al., "Whispering-Gallery-Mode Resonators as Frequency References. II. Stabilization," *J. Opt. Soc. Am. B*, 24(12):2988-2997, Dec. 2007.

Vassiliev, V.V., et al., "Narrow-Line-Width Diode Laser with a High-$Q$ Microsphere Resonator," *Optics Communications*, 158(1-6):305-312, Dec. 1998.

Yao, X.S., et al., "A Novel Photonic Oscillator," *Digest of the LEOS Summer Topical Meetings*, pp. 17-18, Aug. 1995.

Yao, X.S., et al., "A Novel Photonic Oscillator," *TDA Progress Report 42-122*, pp. 32-43, Aug. 1995.

Yao, X.S., et al., "Converting Light into Spectrally Pure Microwave Oscillation," *Optics Letters*, 21(7):483-485, Apr. 1996.

Yao, X.S., et al., "Coupled Optoelectronic Oscillators for Generating Both RF Signal and Optical Pulses," *Journal of Lightwave Tecnhology*, 18(1):73-78, Jan. 2000.

Yao, X.S., et al., "Dual Microwave and Optical Oscillator," *Optics Letters*, 22(24):1867-1869, Dec. 1997.

Yao, X.S., et al., "Multiloop Optoelectronic Oscillator," *IEEE Journal of Quantum Electronics*, 36(1):79-84, Jan. 2000.

Yao, X.S., et al., "Optoelectronic Microwave Oscillator," *J. Opt. Soc. Am. B*, 13(8):1725-1735, Aug. 1996.

Yao, X.S., et al., "Optoelectronic Oscillator for Photonic Systems," *IEEE Journal of Quantum Electronics*, 32(7):1141-1149, Jul. 1996.

Yu, J., et al., "Compact Optoelectronic Oscillator with Ultra-Low Phase Noise Performance," *Electronics Letters*, 35(18):1554-1555, Sep. 1999.

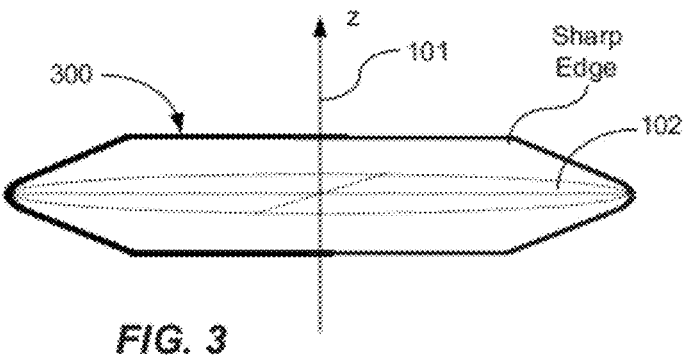
FIG. 3
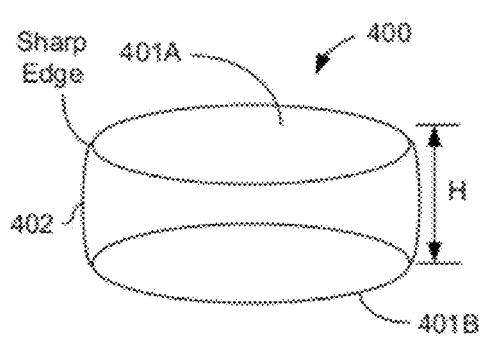
FIG. 4A
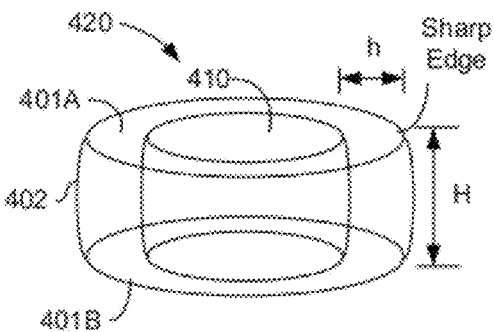
FIG. 4B
FIG. 5A          FIG. 5B

PARAMETRIC REGENERATIVE OSCILLATORS BASED ON OPTO-ELECTRONIC FEEDBACK AND OPTICAL REGENERATION VIA NONLINEAR OPTICAL MIXING IN WHISPERING GALLERY MODE OPTICAL RESONATORS

PRIORITY CLAIM AND CROSS-REFERENCES TO RELATED APPLICATIONS

This patent document claims the priority of U.S. Provisional Application No. 61/500,542 entitled "PARAMETRIC REGENERATIVE OSCILLATORS" and filed on Jun. 23, 2011. The entire disclosure of the above patent application is incorporated by reference as part of the disclosure of this document.

BACKGROUND

This application relates to signal oscillators based on photonic devices.

Radio frequency (RF) and microwave oscillators for generating signals in the RF and microwave frequencies are used in a wide range of applications including circuits, communication devices and others. Such RF and microwave oscillators may be constructed as "hybrid" devices by using both electronic and optical components to form opto-electronic oscillators ("OEOs"). See, e.g., U.S. Pat. Nos. 5,723,856, 5,777,778, 5,929,430 and 6,567,436.

For example, such an OEO can include an electrically controllable optical modulator and at least one active opto-electronic feedback loop that includes an optical part and an electrical part interconnected by a photodetector. The opto-electronic feedback loop receives the modulated optical output from the modulator and converted the modulated optical output into an electrical signal which is applied to control the modulator. The feedback loop produces a desired long delay in the optical part of the loop to suppress phase noise and feeds the converted electrical signal in phase to the modulator to generate the optical modulation and generate and sustain an electrical oscillation in RF or microwave frequencies when the total loop gain of the active opto-electronic loop and any other additional feedback loops exceeds the total loss. Such an opto-electronic loop is an active, in-phase loop that oscillates and thus is different from the conventional feedback loop that stabilizes a device at a particular stable operating condition or state. The generated oscillating signals are tunable in frequency and can have narrow spectral linewidths and low phase noise in comparison with the signals produced by other RF and microwaves oscillators.

SUMMARY

This document provides techniques and devices based on optical resonators made of nonlinear optical materials to provide nonlinear wave mixing and as part of an active opto-electronic loop to produce a low-noise RF signal.

In one aspect, a method is provided for producing a low-noise RF signal based on optical regenerative oscillation from optical nonlinearity in an optical whispering gallery mode resonator. This method includes coupling laser light at an optical pump frequency into an optical whispering gallery mode resonator that supports whispering gallery modes and exhibits optical nonlinearity to cause nonlinear optical mixing and parametric amplification by taking energy from the laser light at the optical pump frequency to generate light at one or more new optical frequencies different from the optical pump frequency; operating a modulation device that causes a modulation in the laser light based on an RF signal containing an RF frequency and one or more RF harmonics of the RF frequency and being applied to the modulation device to produce modulated laser light having modulation bands correspond to the RF frequency and the one or more RF harmonics inside the optical whispering gallery mode resonator and to cause nonlinear optical mixing of light in the optical whispering gallery mode resonator at the optical pump frequency and the modulation bands to transfer power from the optical pump frequency to the modulation bands; coupling light out of the optical whispering gallery mode resonator into a photodetector to produce an RF detector output at the RF frequency and one or more RF harmonics of the RF frequency based on demodulation at the photodetector of light at the optical pump frequency and the modulation bands; directing the RF detector output into an RF circuit that processes the RF signal based on the RF detector output; and operating the optical whispering gallery mode resonator, the modulation device, the photodetector and the RF circuit to form an active opto-electronic oscillator loop to sustain an opto-electronic oscillation to sustain the RF signal containing at least some of the RF frequency and the one or more RF harmonics of the RF frequency in the RF circuit and to reduce a phase noise in the RF signal via the nonlinear optical mixing and filtering by the optical whispering gallery mode resonator.

In another aspect, a device is provided for producing a low-noise RF signal based on regenerating light via optical nonlinearity in an optical whispering gallery mode resonator. This device includes a laser that produces laser light at an optical pump frequency; an optical whispering gallery mode resonator that supports whispering gallery modes and exhibits optical nonlinearity to cause nonlinear optical mixing and parametric amplification by taking energy from the laser light at the optical pump frequency to generate light at one or more new optical frequencies different from the optical pump frequency; an optical coupler that couples the laser light from the laser into the optical whispering gallery mode resonator; and an optical modulator located in an optical path between the laser and the optical whispering gallery mode resonator. The optical modulator is operable to cause a modulation in the laser light based on an RF signal containing an RF frequency and one or more RF harmonics of the RF frequency and being applied to the modulation device to produce modulated laser light having modulation bands correspond to the RF frequency and the one or more RF harmonics. The modulated laser light at the optical pump frequency and the modulation bands inside the optical whispering gallery mode resonator undergo nonlinear optical mixing to transfer power at the optical pump frequency to optical frequencies corresponding to the modulation bands. This device includes a photodetector coupled to receive light coming out of the optical whispering gallery mode resonator to produce an RF detector output at the RF frequency and one or more RF harmonics of the RF frequency based on demodulation at the photodetector of light at the optical pump frequency and the modulation bands; and an RF circuit coupled to receive the RF detector output and operable to process the RF signal based on the RF detector output. In this device, the optical modulator, the optical whispering gallery mode resonator, the photodetector and the RF circuit are configured to form an active opto-electronic oscillator loop to sustain an opto-electronic oscillation that sustains the RF signal containing at least some of the RF frequency and the one or more RF harmonics of the RF frequency in the RF circuit and to reduce a phase noise in the RF signal via the nonlinear optical mixing and filtering by the optical whispering gallery mode resonator in the active opto-electronic oscillator loop.

In yet another aspect, a device is provided for producing a low-noise RF signal based on regenerating light via optical nonlinearity in an optical whispering gallery mode resonator. This device includes a laser that produces laser light at an optical pump frequency; an optical whispering gallery mode resonator that supports whispering gallery modes and exhibits optical nonlinearity to cause nonlinear optical mixing by taking energy from the laser light at the optical pump frequency to generate light at one or more new optical frequencies different from the optical pump frequency, the optical whispering gallery mode resonator exhibiting an opto-electric effect; an electrode formed on the optical whispering gallery mode resonator to apply an RF signal containing an RF frequency and one or more RF harmonics of the RF frequency to the optical whispering gallery mode resonator to cause optical modulation of light inside the optical whispering gallery mode resonator via the opto-electric effect; and an optical coupler that couples the laser light from the laser into the optical whispering gallery mode resonator, the laser light coupled inside the optical whispering gallery mode resonator being modulated to include modulation bands corresponding to the RF frequency and the one or more RF harmonics, wherein the modulated laser light at the optical pump frequency and the modulation bands inside the optical whispering gallery mode resonator undergoes the nonlinear optical mixing to transfer power at the optical pump frequency to the modulation bands. This device includes a photodetector coupled to receive light coming out of the optical whispering gallery mode resonator to produce an RF detector output at the RF frequency and one or more RF harmonics of the RF frequency based on demodulation at the photodetector of light at the optical pump frequency and the modulation bands; and an RF circuit coupled to receive the RF detector output and operable to produce the RF signal based on the RF detector output. The RF circuit is coupled to the electrode on the optical whispering gallery mode resonator to apply the RF signal to cause optical modulation inside the optical whispering gallery mode resonator. The optical modulator, the optical whispering gallery mode resonator, the photodetector and the RF circuit are configured to form an active opto-electronic oscillator loop to sustain an opto-electronic oscillation that sustains the RF signal containing at least some of the RF frequency and the one or more RF harmonics of the RF frequency in the RF circuit and to reduce a phase noise in the RF signal via the nonlinear optical mixing and filtering by the optical whispering gallery mode resonator in the active opto-electronic oscillator loop.

These and other aspects and implementations are described in detail in the drawings, the description and the claims.

BRIEF DESCRIPTION OF THE DRAWINGS

FIGS. 2A, 2B, 3, 4A, 4B, 5A and 5B show examples of WGM resonators and optical coupling designs.

DETAILED DESCRIPTION

Figure 1:
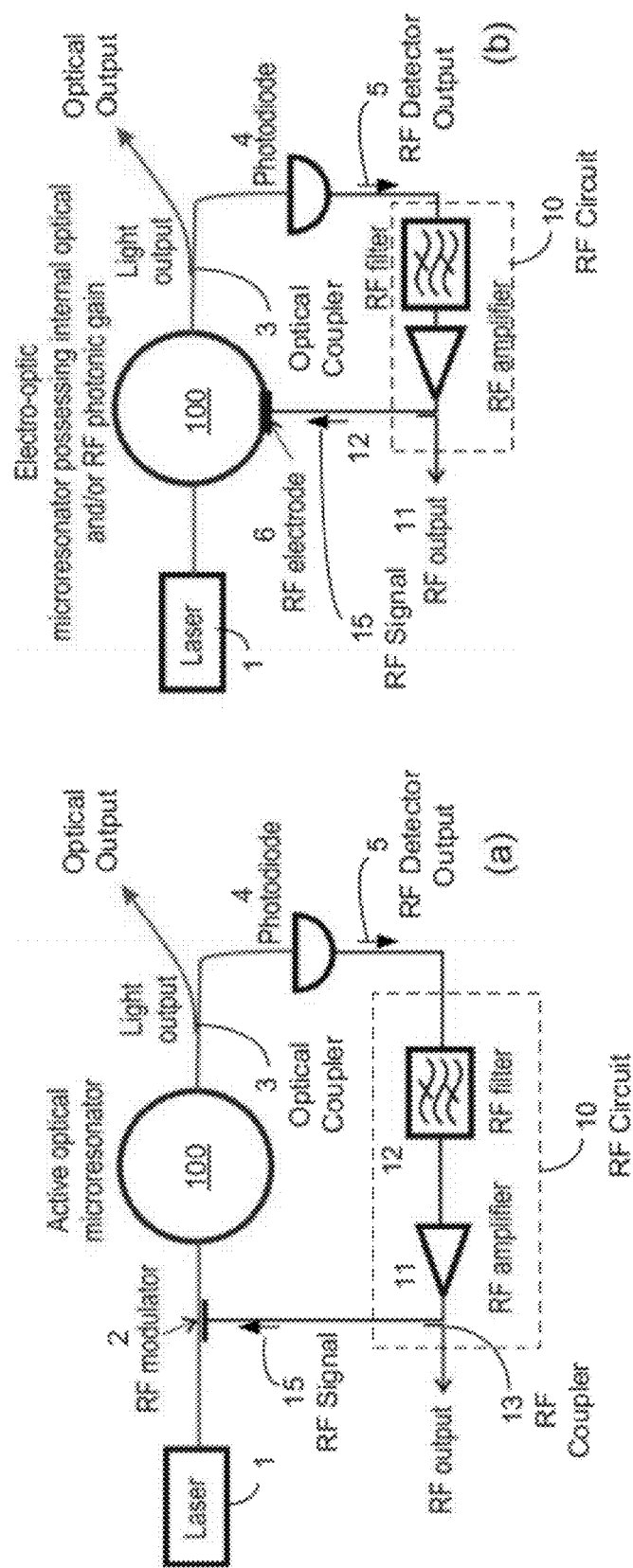
FIG. 1 shows two examples of oscillator devices for producing a low-noise RF signal based on regenerating light via optical nonlinearity in an optical whispering gallery mode resonator and active OEO loop.

This patent document describes implementations of photonic RF or microwave oscillators based on the nonlinear process of four wave mixing (FWM) in crystalline whispering gallery mode resonators such as calcium fluoride or another material possessing cubic nonlinearity. Such devices can be packaged in small packages. In FWM, the large field intensity in the high finesse WGM transforms two pump photons into two sideband photons, i.e., a signal photon and an idler photon. The sum of frequencies of the generated photons is equal to twice the frequency of the pumping light because of the energy conservation law. By supersaturating the oscillator and using multiple optical harmonics generated in the resonator (optical comb), the described oscillators can reduce the phase noise and increase spectral purity of the RF or microwave signals generated on a fast optical detector such as a photodiode. In addition, the disclosed photonic RF or microwave oscillators implement active opto-electronic feedback loop to generate and sustain opto-electronic oscillations to further reduce the phase noise and the stability of the oscillators.

The optical resonators may be configured as optical whispering-gallery-mode ("WGM") resonators which support a special set of resonator modes known as whispering gallery ("WG") modes. These WG modes represent optical fields confined in an interior region close to the surface of the resonator due to the total internal reflection at the boundary. For example, a dielectric sphere may be used to form a WGM resonator where WGM modes represent optical fields confined in an interior region close to the surface of the sphere around its equator due to the total internal reflection at the sphere boundary. Quartz microspheres with diameters on the order of $10$~$10^2$ microns have been used to form compact optical resonators with Q values greater than $10^9$. Such hi-Q WGM resonators may be used to produce oscillation signals with high spectral purity and low noise. Optical energy, once coupled into a whispering gallery mode, can circulate at or near the sphere equator over a long photon life time.

The oscillators described here generate RF, microwave or mm-wave signals with improved spectral purity based optical nonlinear mixing and regeneration in an optical whispering gallery mode resonator based on parametric amplification. Employing optical parametric gain (based on quadratic or cubic optical, radiofrequency, acoustical, and/or mechanical nonlinearity) or optical phase independent gain in RF photonic oscillators based on the nonlinear (active) optical microresonators allows achieving generation of low noise RF signals. Spectral purity of those signals can be improved compared with i) the spectral purity of signals generated in other RF photonic oscillators that have linear (passive) optical microresonators in their loops; and, ii), spectral purity of the RF photonic oscillators based on the self-oscillating nonlinear (active) optical microresonators.

The combination of the active opto-electronic loop and the optical regeneration based on optical nonlinear mixing and parametric amplification in the devices and techniques described in this document provide coupling between the active opto-electronic loop and the optical regeneration similar to the coupling of the laser oscillation and the active opto-electronic loop in Coupled Opto-Electronic Oscillators (COEOs). This coupling allows for achieving phase noise lower than the phase noise of other Opto-Electronic Oscillators (OEOs) having the similar loop length (e.g., the same or similar length of optical fiber in the loop). A COEO is a regenerative device with both optical and RF gain (active optical and RF loop), while various OEOs without direct coupling between the laser oscillation and the OEO loop has a passive optical loop and active RF loop. The COEO is more efficient since its effective RF quality (Q) factor depends on the width of the optical spectrum generated in the active optical loop and is much larger compared with the effective Q-factor of the passive optical fiber loop of the same length used in an OEO.

The photonic oscillators based on the above combination and coupling of the active opto-electronic loop and the optical regeneration based on optical nonlinear mixing and parametric amplification are described in detail in the following examples.

WGM resonators made of crystals can be optically superior to WGM resonators made of fused silica. WGM resonators made of crystalline $CaF_2$ can produce a Q factor at or greater than $10^{10}$. Such a high Q value allows for various applications, including generation of kilohertz optical resonances and low-threshold optical hyperparametric oscillations due to the Kerr nonlinear effect. The following sections first describe the exemplary geometries for crystal WGM resonators and then describe the properties of WGM resonators made of different materials. In some of the examples described below, in addition to the nonlinear optical property of the material for the WGM resonators, the material may also exhibit electro-optic effect in response to an externally applied control signal, e.g., an RF signal, to provide optical modulation.

FIG. 1 shows two examples of oscillator devices for producing a low-noise RF signal based on regenerating light via optical nonlinearity in an optical whispering gallery mode resonator and active OEO loop. The devices in FIG. 1 combines the OEO loop in an OEO device and the pure optical RF signal generator based on the nonlinear mixing and parametric amplification in the WGM resonator to reduce the phase noise to a level that is difficult to achieve with other devices including other OEO devices. The reason for the improvement is in the usage of both active RF and optical loops and their coupling. Regeneration of optical signal results in an improvement of the phase noise of the generated RF signal. Moreover, inserting an optional RF filter into the RF loop allows regulating the properties of the optical spectrum generated in the optical loop.

In the two examples in FIG. 1, laser light at an optical pump frequency is coupled into an optical whispering gallery mode resonator 100 that supports whispering gallery modes and exhibits optical nonlinearity to cause nonlinear optical mixing and parametric amplification by taking energy from the laser light at the optical pump frequency to generate light at one or more new optical frequencies different from the optical pump frequency. A modulation device is provided to cause a modulation in the laser light, either inside or outside the WGM resonator 100, based on a radio frequency (RF) signal 15 containing an RF frequency and one or more RF harmonics of the RF frequency. This RF signal is applied to the modulation device to produce modulated laser light having modulation bands correspond to the RF frequency and the one or more RF harmonics inside the optical whispering gallery mode resonator 100 and to cause nonlinear optical mixing of light at the optical pump frequency and the modulation bands to transfer power at the optical pump frequency to optical frequencies corresponding to the modulation bands. The light inside the resonator 100 is coupled out into a photodetector 4 to produce an RF detector output 5 at the RF frequency and one or more RF harmonics of the RF frequency based on demodulation at the photodetector 4 of light at the optical pump frequency and the modulation bands. The RF detector output is directed into an RF circuit 10 that produces the RF signal 15 based on the RF detector output 5. The optical whispering gallery mode resonator 100, the modulation device, the photodetector 4 and the RF circuit 10 are configured to form an active opto-electronic oscillator loop to sustain an opto-electronic oscillation to sustain the RF signal 15 containing at least some of the RF frequency and the one or more RF harmonics of the RF frequency in the RF circuit 10 and to reduce a phase noise in the RF signal 15 via the nonlinear optical mixing and filtering by the optical whispering gallery mode resonator 100 in the active opto-electronic oscillator loop.

In the RF circuit 10, the RF circuit 10 in the active opto-electronic oscillator loop is configured to effectuate an RF passband or transmission band that selects the some of the RF frequency and the one or more RF harmonics of the RF frequency to be in the RF signal while eliminating other RF frequencies. In addition to this RF filtering built in the OEO loop, some implementations may provide an RF filter 12 (e.g., a bandpass RF filter) in the RF circuit 10 to regulate an optical spectrum of light generated by the nonlinear optical mixing inside the optical whispering gallery mode resonator 100 by the RF circuit's selecting some of the RF frequency and the one or more RF harmonics of the RF frequency while eliminating other RF frequencies. The bandpass RF filter 12 can be in various configurations, including RF filters formed of electronic circuit components and photonic RF filters formed of both electronic circuit components and optical components such as high-Q optical resonators. The RF circuit 10 may include an RF amplifier 11 that amplifies the RF signal to ensure the RF gain in the loop is significant large to exceed the RF loop to generate and sustain the RF oscillation.

In some implementations of photonic RF filters, a part of the processing is performed in the RF and microwave domain such as applying a microwave or RF input signal to an optical modulator to control optical modulation of light, and another part of the processing is performed in the optical domain such as optical filtering of the modulated light to select one or more desired microwave or RF spectral components as the filtered output. The frequency of a selected spectral component can be tuned by either tuning the frequency of the light that is modulated by the optical modulator or an optical filter that is used to optically filter modulated optical beam. Photonic RF filters use an input port to receive a microwave or RF signal, and an output port to export a filtered microwave or RF signal. The input signal is converted into optical domain via optical modulation of a continuous-wave optical beam and the modulated optical beam is then optically filtered to select desired microwave or RF spectral components. An optical filter with a high quality factor can produce ultra narrow linewidth to optically select one or more desired microwave or RF spectral components carried in the modulated optical beam. Such optical filtering of microwave or RF spectral components avoids use of microwave or RF filters that tend to suffer a number of limitations imposed by the electronic microwave or RF circuit elements. The filtered optical signal and a portion of the same continuous-wave optical beam are combined and sent into an optical detector. The output of the optical detector is used as the filtered or processed non-optical signal. Like signal filtering, the frequency tuning of the filtering in these implementations can also be achieved optically in some implementations, e.g., by either tuning the frequency of the optical beam that is modulated by the optical modulator or an optical filter that is used to filter modulated optical beam. Examples of photonic RF filters can be found in U.S. Pat.

Nos. 7,587,144 for Tunable radio frequency and microwave photonic filters, 7,634,201 for Wideband receiver based on photonics technology, 7,389,053 for Tunable filtering of RF or microwave signals based on optical filtering in Mach-Zehnder configuration, which are incorporated by reference as part of the disclosure of this patent document.

Referring to FIG. 1(a), the device includes a laser 1 that produces laser light at the optical pump frequency. The laser 1 can be a semiconductor laser or another suitable laser, e.g., a CW diode laser. The laser 1 and the resonator 100 can be locked to each other to improve the stability of the device. This locking can be achieved by using a laser locking circuit or using an optical injection locking technique by injecting light from the resonator 100 back to the laser 1.

The modulation device in FIG. 1(a) is an optical modulator 2 that receives the RF signal 15 from the RF circuit 10 of the OEO loop. This optical modulator 2 is located in an optical path between the laser 1 and the optical whispering gallery mode resonator 100 and is operable to cause a modulation in the laser light based on the RF signal 15 to produce modulated laser light having modulation bands correspond to the RF frequency and the one or more RF harmonics. The modulated laser light at the optical pump frequency and the modulation bands inside the optical whispering gallery mode resonator 100 undergoes the nonlinear optical mixing and parametric amplification to transfer power at the optical pump frequency to optical frequencies corresponding to the modulation bands. The optical modulator 2, the optical whispering gallery mode resonator 100, the photodetector 4 and the RF circuit 10 are configured to form the active opto-electronic oscillator loop. In this device, the resonator 100 regenerates optical light via nonlinear optical mixing and parametric amplification, and the high Q factor of the resonator 100 reduces the phase noise and enhances the spectral purity. The optical microresonator 100 plays the role of RF photonic filter in the OEO loop.

FIG. 1(b) shows another example where the optical modulator 2 is eliminated and replaced by a resonator 100 with an electro-optic effect in addition to the nonlinear optical property for the desired optical wave mixing. One or more RF electrodes 6 are formed on the resonator 100 to apply the RF signal 15 to cause the optical modulation inside the resonator 100 via the electro-optic effect. In this example, the resonator 100 plays roles of both RF photonic filter and the optical modulator. The optical microresonator here is considered as a passive device in this particular scheme since it cannot oscillate.

Figure 2A:
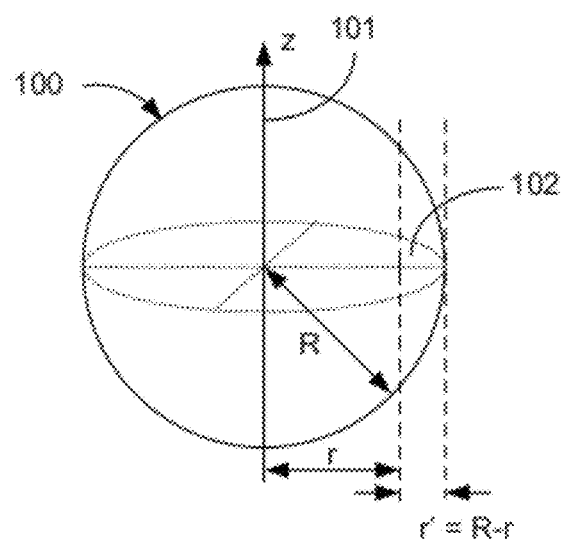
Figure 2B:
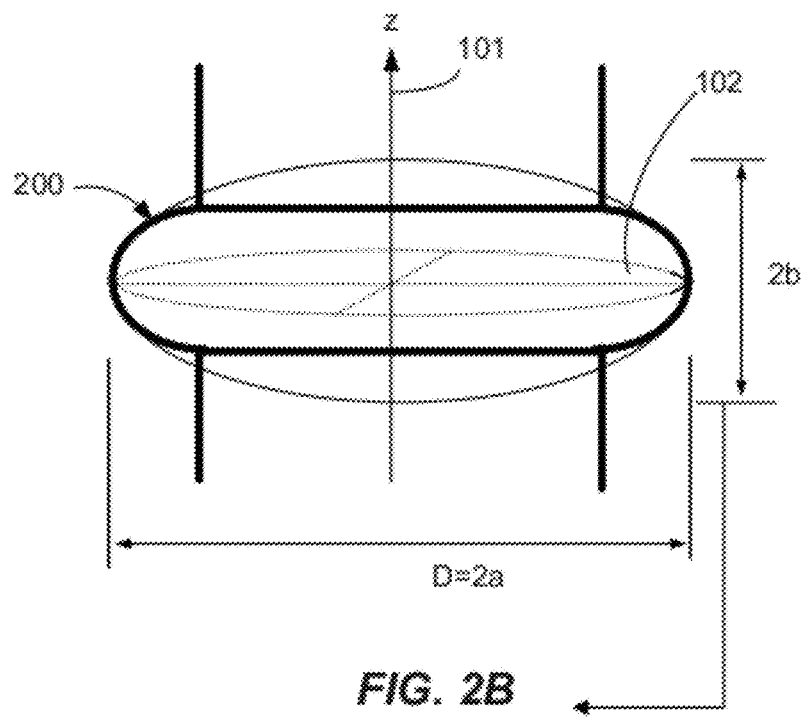

FIGS. 2A, 2B, and 3 illustrate three exemplary WGM resonators. FIG. 2A shows a spherical WGM resonator 100 which is a solid dielectric sphere. The sphere 100 has an equator in the plane 102 which is symmetric around the z axis 101. The circumference of the plane 102 is a circle and the plane 102 is a circular cross section. A WG mode exists around the equator within the spherical exterior surface and circulates within the resonator 100. The spherical curvature of the exterior surface around the equator plane 102 provides spatial confinement along both the z direction and its perpendicular direction to support the WG modes. The eccentricity of the sphere 100 generally is low.

FIG. 2B shows an exemplary spheroidal microresonator 200. This resonator 200 may be formed by revolving an ellipse (with axial lengths a and b) around the symmetric axis along the short elliptical axis 101 (z). Therefore, similar to the spherical resonator in FIG. 2A, the plane 102 in FIG. 2B also has a circular circumference and is a circular cross section. Different from the design in FIG. 2A, the plane 102 in FIG. 2B is a circular cross section of the non-spherical spheroid and around the short ellipsoid axis of the spheroid. The eccentricity of resonator 100 is $(1-b^2/a^2)^{1/2}$ and is generally high, e.g., greater than $10^{-1}$. Hence, the exterior surface is the resonator 200 is not part of a sphere and provides more spatial confinement on the modes along the z direction than a spherical exterior. More specifically, the geometry of the cavity in the plane in which Z lies such as the zy or zx plane is elliptical. The equator plane 102 at the center of the resonator 200 is perpendicular to the axis 101 (z) and the WG modes circulate near the circumference of the plane 102 within the resonator 200.

FIG. 3 shows another exemplary WGM resonator 300 which has a non-spherical exterior where the exterior profile is a general conic shape which can be mathematically represented by a quadratic equation of the Cartesian coordinates. Similar to the geometries in FIGS. 1 and 2, the exterior surface provides curvatures in both the direction in the plane 102 and the direction of z perpendicular to the plane 102 to confine and support the WG modes. Such a non-spherical, non-elliptical surface may be, among others, a parabola or hyperbola. Note that the plane 102 in FIG. 3 is a circular cross section and a WG mode circulates around the circle in the equator.

The above three exemplary geometries in FIGS. 2A, 2B, and 3 share a common geometrical feature that they are all axially or cylindrically symmetric around the axis 101 (z) around which the WG modes circulate in the plane 102. The curved exterior surface is smooth around the plane 102 and provides two-dimensional confinement around the plane 102 to support the WG modes.

Notably, the spatial extent of the WG modes in each resonator along the z direction 101 is limited above and below the plane 102 and hence it may not be necessary to have the entirety of the sphere 100, the spheroid 200, or the conical shape 300. Instead, only a portion of the entire shape around the plane 102 that is sufficiently large to support the whispering gallery modes may be used to form the WGM resonator. For example, rings, disks and other geometries formed from a proper section of a sphere may be used as a spherical WGM resonator.

FIGS. 4A and 4B show a disk-shaped WGM resonator 400 and a ring-shaped WGM resonator 420, respectively. In FIG. 4A, the solid disk 400 has a top surface 401A above the center plane 102 and a bottom surface 401B below the plane 102 with a distance H. The value of the distance H is sufficiently large to support the WG modes. Beyond this sufficient distance above the center plane 102, the resonator may have sharp edges as illustrated in FIGS. 3, 4A, and 4B. The exterior curved surface 402 can be selected from any of the shapes shown in FIGS. 1, 2, and 3 to achieve desired WG modes and spectral properties. The ring resonator 420 in FIG. 4B may be formed by removing a center portion 410 from the solid disk 400 in FIG. 4A. Since the WG modes are present near the exterior part of the ring 420 near the exterior surface 402, the thickness h of the ring may be set to be sufficiently large to support the WG modes.

An optical coupler is generally used to couple optical energy into or out of the WGM resonator by evanescent coupling. FIGS. 5A and 5B show two exemplary optical couplers engaged to a WGM resonator. The optical coupler may be in direct contact with or separated by a gap from the exterior surface of the resonator to effectuate the desired critical coupling. FIG. 5A shows an angle-polished fiber tip as a coupler for the WGM resonator. A waveguide with an angled end facet, such as a planar waveguide or other waveguide, may also be used as the coupler. FIG. 5B shows a micro prism as a coupler for the WGM resonator. Other evanescent couplers may also be used, such as a coupler formed from a photonic bandgap material.

WGM resonators can be used to provide an effective way to confine photons in small volumes for long periods of time. As such, WGM resonators have a wide range of applications in both fundamental studies and practical devices. For example, WGM resonators can be used for storage of light with linear optics, as an alternative to atomic light storage, as well as in tunable optical delay lines, a substitute for atomic-based slow light experiments. WGM resonators can also be used for optical filtering and opto-electronic oscillators, among other applications.

Amongst many parameters that characterize a WGM resonator (such as efficiency of in and out coupling, mode volume, free spectral range, etc.) the quality factor (Q) is a basic one. The Q factor is related to the lifetime of light energy in the resonator mode ($\tau$) as $Q=2\pi\nu\tau$, where $\nu$ is the linear frequency of the mode. The ring down time corresponding to a mode with $Q=2\times10^{10}$ and wavelength $\Sigma=1.3$ Tm is 15 Ts, thus making ultrahigh Q resonators potentially attractive as light storage devices. Furthermore, some crystals are transparent enough to allow extremely high-Q whispering gallery modes while having important nonlinear properties to allow continuous manipulation of the WGMs' characteristics and further extend their usefulness.

In a dielectric resonator, the maximum quality factor cannot exceed $Q_{max}=2\pi n_0/(\Sigma I)$, where $n_0$ is the refractive index of the material, $\Sigma$ is the wavelength of the light in vacuum, and I is the absorption coefficient of the dielectric material. The smaller the absorption, the larger is $Q_{max}$. Hence, to predict the narrowest possible linewidth $K=\tau^{-1}$ of a WGM one has to know the value of optical attenuation in transparent dielectrics—within their transparency window—within which the losses are considered negligible for the vast majority of applications. This question about the residual fundamental absorption has remained unanswered for most materials because of a lack of measurement methods with adequate sensitivity. Fortunately, high-Q whispering gallery modes themselves represent a unique tool to measure very small optical attenuations in a variety of transparent materials.

Previous experiments with WGM resonators fabricated by thermal reflow methods applicable to amorphous materials resulted in Q factors less than $9\times10^9$. The measurements were performed with fused silica microcavities, where surface-tension forces produced nearly perfect resonator surfaces, yielding a measured Q factor that approached the fundamental limit determined by the material absorption. It is expected that optical crystals would have less loss than fused silica because crystals theoretically have a perfect lattice without inclusions and inhomogeneities that are always present in amorphous materials. The window of transparency for many crystalline materials is much wider than that of fused silica. Therefore, with sufficiently high-purity material, much smaller attenuation in the middle of the transparency window can be expected-as both the Rayleigh scattering edge and multiphonon absorption edge are pushed further apart towards ultraviolet and infrared regions, respectively. Moreover, crystals may suffer less, or not at all, the extrinsic absorption effects caused by chemosorption of OH ions and water, a reported limiting factor for the Q of fused silica near the bottom of its transparency window at 1.55 µm.

Until recently, one remaining problem with the realization of crystalline WGM resonators was the absence of a fabrication process that would yield nanometer-scale smoothness of spheroidal surfaces for elimination of surface scattering. Very recently this problem was solved. Mechanical optical polishing techniques have been used for fabricating ultrahigh-Q crystalline WGM resonators with Q approaching $10^9$. In this document, high quality factors ($Q=2\times10^{10}$) in WGM resonators fabricated with transparent crystals are further described.

Crystalline WGM resonators with kilohertz-range resonance bandwidths at the room temperature and high resonance contrast (50% and more) are promising for integration into high performance optical networks. Because of small modal volumes and extremely narrow single-photon resonances, a variety of low-threshold nonlinear effects can be observed in WGM resonators based on small broadband nonlinear susceptibilities. As an example, below we report the observation of thermo-optical instability in crystalline resonators, reported earlier for much smaller volume high-Q silica microspheres.

There is little consistent experimental data on small optical attenuation within transparency windows of optical crystals. For example, the high sensitivity measurement of the minimum absorption of specially prepared fused silica, I=0.2 dB/km at $\Sigma=1.55$ Tm, ($-I\geq10^{-7}$ cm$^{-1}$) becomes possible only because of kilometers of optical fibers fabricated from the material. Unfortunately, this method is not applicable to crystalline materials. Fibers have also been grown out of crystals such as sapphire, but attenuation in those (few dB per meter) was determined by scattering of their surface. Calorimetry methods for measurement of light absorption in transparent dielectrics give an error on the order of $-I\geq10^{-7}$ cm$^{-1}$. Several transparent materials have been tested for their residual absorption with calorimetric methods, while others have been characterized by direct scattering experiments, both yielding values at the level of a few ppm/cm of linear attenuation, which corresponds to the Q limitation at the level of $10^{10}$. The question is if this is a fundamental limit or the measurement results were limited by the imperfection of crystals used.

Selection of material for highest-Q WGM resonators must be based on fundamental factors, such as the widest transparency window, high-purity grade, and environmental stability. Alkali halides may not be suitable due to their hygroscopic property and sensitivity to atmospheric humidity. Bulk losses in solid transparent materials can be approximated with the phenomenological dependence $$\alpha = \alpha_{UV} e^{\lambda_{UV}/\lambda} + \alpha_R \lambda^{-4} + \alpha_{IR} e^{-\lambda_{IR}/\lambda}, \quad (1)$$

where $I_{UV}$, $I_R$, and $I_{IR}$ represent the blue wing (primary electronic), Rayleigh, and red wing (multiphonon) losses of the light, respectively; $\Sigma_{UV}$, and $\Sigma_{IR}$ stand for the edges of the material transparency window. This expression does not take into account resonant absorption due to possible crystal impurities. Unfortunately, coefficients in Eq. (1) are not always known.

One example of nonlinear materials for fabrication of high-Q WGM resonators with optical nonlinear behaviors is calcium fluoride ($CaF_2$). This material is useful in various applications because of its use in ultraviolet lithography applications at 193 and 157 nm. Ultrapure crystals of this material suitable for wide aperture optics have been grown, and are commercially available. According to recently reported measurements on scattering in $CaF_2$ I=$3\times10^{-5}$ cm$^{-1}$ at 193 nm, extremely small scattering can be projected in the near-infrared band corresponding to the limitation of Q at the level of $10^{13}$.

Lattice absorption at this wavelength can be predicted from the position of the middle infrared multiphonon edge, and yields even smaller Q limitations. Because of residual doping and nonstoichiometry, both scattering and absorption are present and reduce the Q in actual resonators. An additional source for Q limitation may be the scattering produced by the residual surface inhomogeneities resulting from the polishing techniques. At the limit of conventional optical polishing quality (average roughness σ=2 nm), the estimates based on the waveguide model for WGM surface scattering yield $Q \simeq 10^{11}$.

We studied WGM resonators fabricated with calcium fluoride and a few other crystalline materials made of $LiNbO_2$, $LiTaO_2$ and $Al_2O_3$, and measured their quality factors. $CaF_2$ resonators were fabricated by core-drilling of cylindrical preforms and subsequent polishing of the rim of the preforms into spheroidal geometry. The fabricated resonators had a diameter of 4-7 millimeters and a thickness of 0.5-1 mm. The fabricated Calcium fluoride resonators had a Q factor of about $2 \times 10^{10}$.

Measurement of the Q was done using the prism coupling method. The intrinsic Q was measured from the bandwidth of the observed resonances in the undercoupled regime. Because of different refraction indices in resonators, we used BK7 glass prisms (n=1.52) for silica (n=1.44) and calcium fluoride (n=1.43), diamond (n=2.36) for lithium niobate (n=2.10, 2.20), and lithium niobate prism (n=2.10) for sapphire (n=1.75). We used extended cavity diode lasers at 760 nm, distributed feedback semiconductor lasers at 1550 nm, and solid-state YAG lasers at 1319 nm as the light source.

A high-Q nonlinear WGM resonators can be used for achieving low-threshold optical hyperparametric oscillations. The oscillations result from the resonantly enhanced four-wave mixing occurring due to the Kerr nonlinearity of the material. Because of the narrow bandwidth of the resonator modes as well as the high efficiency of the resonant frequency conversion, the oscillations produce stable narrow-band beat-note of the pump, signal, and idler waves. A theoretical model for this process is described.

Realization of efficient nonlinear optical interactions at low light levels has been one of the main goals of non-linear optics since its inception. Optical resonators contribute significantly to achieving this goal, because confining light in a small volume for a long period of time leads to increased nonlinear optical interactions. Optical whispering gallery mode (WGM) resonators are particularly well suited for the purpose. Features of high quality factors (Q) and small mode volumes have already led to the observation of low-threshold lasing as well as efficient nonlinear wave mixing in WGM resonators made of amorphous materials.

Optical hyperparametric oscillations, dubbed as modulation instability in fiber optics, usually are hindered by small nonlinearity of the materials, so high-power light pulses are required for their observation. Though the nonlinearity of $CaF_2$ is even smaller than that of fused silica, we were able to observe with low-power continuous wave pump light a strong nonlinear interaction among resonator modes resulting from the high Q ($Q > 5 \times 10^9$) of the resonator. New fields are generated due to this interaction.

The frequency of the microwave signal produced by mixing the pump and the generated side-bands on a fast photodiode is stable and does not experience a frequency shift that could occur due to the self- and cross-phase modulation effects. Conversely in, e.g., coherent atomic media, the oscillations frequency shifts to compensate for the frequency mismatch due to the cross-phase modulation effect (ac Stark shift). In our system the oscillation frequency is given by the mode structure and, therefore, can be tuned by changing the resonator dimensions. Different from resonators fabricated with amorphous materials and liquids, high-Q crystalline resonators allow for a better discrimination of the third-order nonlinear processes and the observation of pure hyperparametric oscillation signals. As a result, the hyperoscillator is promising for applications as an all-optical secondary frequency reference.

The hyperparametric oscillations could be masked with stimulated Raman scattering (SRS) and other non-linear effects. For example, an observation of secondary lines in the vicinity of the optical pumping line in the SRS experiments with WGM silica microresonators was interpreted as four-wave mixing between the pump and two Raman waves generated in the resonator, rather than as the four-photon parametric process based on electronic Kerr nonlinearity of the medium. An interplay among various stimulated nonlinear processes has also been observed and studied in droplet spherical microcavities.

The polarization selection rules together with WGM's geometrical selection rules allow for the observation of nonlinear processes occurring solely due to the electronic nonlinearity of the crystals in crystalline WGM resonators. Let us consider a fluorite WGM resonator possessing cylindrical symmetry with symmetry axis. The linear index of refraction in a cubic crystal is uniform and isotropic, therefore the usual description of the modes is valid for the resonator. The TE and TM families of WGMs have polarization directions parallel and orthogonal to the symmetry axis, respectively. If an optical pumping light is sent into a TE mode, the Raman signal cannot be generated in the same mode family because in a cubic crystal such as $CaF_2$ there is only one, triply degenerate, Raman-active vibration with symmetry $F_{2g}$. Finally, in the ultrahigh Q crystalline resonators, due to the material as well as geometrical dispersion, the value of the free spectral range (FSR) at the Raman detuning frequency differs from the FSR at the carrier frequency by an amount exceeding the mode spectral width. Hence, frequency mixing between the Raman signal and the carrier is strongly suppressed. Any field generation in the TE mode family is due to the electronic nonlinearity only, and Raman scattering occurs in the TM modes.

Consider three cavity modes: one nearly resonant with the pump laser and the other two nearly resonant with the generated optical sidebands. Our analysis begins with the following equations for the slow amplitudes of the intracavity fields $$\dot{A} = -\Gamma_0 A + ig[|A|^2 + 2|B_+|^2 + 2|B_-|^2]A + 2igA^*B_+B_- + F_0,$$

$$\dot{B}_+ = -\Gamma_+ B_+ + ig[2|A|^2 + |B_+|^2 + 2|B_-|^2]B_+ + igB_-^* |A|^2,$$

$$\dot{B}_- = -\Gamma_- B_- + ig[2|A|^2 + 2|B_+|^2 + |B_-|^2]B_- + igB_+^* |A|^2,$$

where $\Gamma_o = i(\omega_o - \omega) + K_o$ and $\Gamma_\pm = i(\omega_\pm - \tilde{\omega}_\pm) + K_\pm$, $K_o$, $K_\pm$, and $\gamma_-$ as well as $\omega_o$, $\omega_+$, and $\omega_-$ are the decay rates and eigenfrequencies of the optical cavity modes respectively; $\omega$ is the carrier frequency of the external pump (A), $\tilde{\omega}_+$ and $\tilde{\omega}_-$ are the carrier frequencies of generated light ($B_+$ and $B_-$, respectively). These frequencies are determined by the oscillation process and cannot be controlled from the outside. However, there is a relation between them (energy conservation law): $2\omega = \tilde{\omega}_+ + \tilde{\omega}_-$. Dimensionless slowly varying amplitudes A, $B_+$, and $B_-$ are normalized such that $|A|^2$, $|B_+|^2$ and $|B_-|^2$ describe photon number in the corresponding modes. The coupling constant can be found from the following expression $$g = \hbar \omega_0^2 n_2 c / V n_o^2$$

where $n_2$ is an optical constant that characterizes the strength of the optical nonlinearity, $n_o$ is the linear refractive index of the material, V is the mode volume, and c is the speed of light in the vacuum. Deriving this coupling constant we assume that the modes are nearly overlapped geometrically, which is true if the frequency difference between them is small. The force $F_o$ stands for the external pumping of the system $F_o = (2K_o P_o/\omega_o)^{1/2}$, where $P_o$ is the pump power of the mode applied from the outside.

For the sake of simplicity we assume that the modes are identical, i.e., $K_+ = K_- = K_o$, which is justified by observation with actual resonators. Then, solving the set (1)-(3) in steady state we find the oscillation frequency for generated fields $$\omega - \tilde{\omega}_- = \tilde{\omega}_+ - \omega = \frac{1}{2}(\omega_+ - \omega_-),$$

i.e., the beat-note frequency depends solely on the frequency difference between the resonator modes and does not depend on the light power or the laser detuning from the pumping mode. As a consequence, the electronic frequency lock circuit changes the carrier frequency of the pump laser but does not change the frequency of the beat note of the pumping laser and the generated sidebands.

The threshold optical power can be found from the steady state solution of the set of three equations for the slow amplitudes of the intracavity fields:

$$P_{th} \simeq 1.54 \frac{\pi}{2} \frac{n_0^2 V}{n_2 \lambda Q^2},$$

where the numerical factor 1.54 comes from the influence of the self-phase modulation effects on the oscillation threshold. The theoretical value for threshold in our experiment is $P_{th} \approx 0.3$ mW, where $n_o = 1.44$ is the refractive index of the material, $n_2 = 3.2 \times 10^{-16}$ cm$^2$/W is the nonlinearity coefficient for calcium fluoride, $V = 10^{-4}$ cm$^3$ is the mode volume, $Q = 6 \times 10^9$, and $\Sigma = 1.32$ μm.

The above equation suggests that the efficiency of the parametric process increases with a decrease of the mode volume. We used a relatively large WGM resonator because of the fabrication convenience. Reducing the size of the resonator could result in a dramatic reduction of the threshold for the oscillation. Since the mode volume may be roughly estimated as $V = 2\pi\Sigma R^2$, it is clear that reducing the radius R by an order of magnitude would result in 2 orders of magnitude reduction in the threshold of the parametric process. This could place WGM resonators in the same class as the oscillators based on atomic coherence. However, unlike the frequency difference between sidebands in the atomic oscillator, the frequency of the WGM oscillator could be free from power (ac Stark) shifts.

Analysis based on the Langevin equations describing quantum behavior of the system suggests that the phase diffusion of the beat-note is small, similar to the low phase diffusion of the hyperparametric process in atomic coherent media. Close to the oscillation threshold the phase diffusion coefficient is $$D_{beat} \simeq \frac{\gamma_0^2}{4} \frac{\hbar \omega_0}{P_{Bout}},$$

where $P_{Bout}$ is the output power in a sideband. The corresponding Allan deviation is a $\sigma_{beat}/\omega_{beat} = (2D_{beat}/t\omega^2_{beat})^{1/2}$. We could estimate the Allan deviation as follows:

$$\sigma_{beat}/\omega_{beat} = 10^{-13}/\sqrt{t}$$

for $K_0 = 3 \times 10^5$ rad/s, $P_{Bout} = 1$ mW, $\omega_0 = 1.4 \times 10^{15}$ rad/s and $\omega_{beat} = 5 \times 10^{10}$ rad/s. Follow up studies of the stability of the oscillations in the general case will be published elsewhere.

Our experiments show that a larger number of modes beyond the above three interacting modes could participate in the process. The number of participating modes is determined by the variation of the mode spacing in the resonator. Generally, modes of a resonator are not equidistant because of the second order dispersion of the material and the geometrical dispersion. We introduce $D = (2\omega_o - \omega_+ - \omega_-)/K_o$ to take the second order dispersion of the resonator into account. If $|D| \geq 1$ the modes are not equidistant and, therefore, multiple harmonic generation is impossible.

Geometrical dispersion for the main mode sequence of a WGM resonator is $D \simeq 0.41 c/(K_0 R n_0 m^{5/3})$, for a resonator with radius R; $\omega_+$, $\omega_0$, and $\omega_-$ are assumed to be m+1, m, and m-1 modes of the resonator ($\omega_m R n_{\omega m} = mc$, m>>1). For R=0.4 cm, $K_0 = 2 \times 10^5$ rad/s, $m = 3 \times 10^4$ we obtain $D = 7 \times 10^{-4}$, therefore the geometrical dispersion is relatively small in our case. However, the dispersion of the material is large enough. Using the Sellmeier dispersion equation, we find $D \simeq 0.1$ at the pump laser wavelength. This implies that approximately three sideband pairs can be generated in the system (we see only two in the experiment).

Furthermore, the absence of the Raman signal in our experiments shows that effective Raman nonlinearity of the medium is lower than the value measured earlier. Theoretical estimates based on numbers from predict nearly equal pump power threshold values for both the Raman and the hyperparametric processes. Using the expression derived for SRS threshold $P_R \simeq \pi 2 n_0^2 V / G \Sigma^2 Q^2$, where $G \simeq 2 \times 10^{-11}$ cm/W is the Raman gain coefficient for $CaF_2$, we estimate $P_{th}/P_R \approx 1$ for any resonator made of $CaF_2$. However, as mentioned above, we did not observe any SRS signal in the experiment.

Therefore, because of the long interaction times of the pumping light with the material, even the small cubic nonlinearity of $CaF_2$ results in an efficient generation of narrowband optical sidebands. This process can be used for the demonstration of a new kind of an all-optical frequency reference. Moreover, the oscillations are promising as a source of squeezed light because the sideband photon pairs generated in the hyperparametric processes are generally quantum correlated.

Photonic microwave oscillators can be built based on generation and subsequent demodulation of polychromatic light to produce a well defined and stable beat-note signal. Hyperparametric oscillators based on nonlinear WGM optical resonators can be used to generate ultrastable microwave signals. Such microwave oscillators have the advantage of a small size and low input power, and can generate microwave signals at any desired frequency, which is determined by the size of the resonator.

Hyperparametric optical oscillation is based on four-wave mixing among two pump, signal, and idler photons by transforming two pump photos in a pump beam into one signal photon and one idler photon. This mixing results in the growth of the signal and idler optical sidebands from vacuum fluctuations at the expense of the pumping wave. A high intracavity intensity in high finesse WGMs results in $\chi(3)$ based four-photon processes like $h\omega + h\omega \rightarrow h(\omega + \omega M) + h(\omega - \omega M)$, where $\omega$ is the carrier frequency of the external pumping, and $\omega M$ is determined by the free spectral range of the resonator $\omega M \approx \Omega FSR$. Cascading of the process and generating multiple equidistant signal and idler harmonics (optical comb) is also possible in this oscillator. Demodulation of the optical output of the oscillator by means of a fast photodiode results in the generation of high frequency microwave signals at frequency ωM. The spectral purity of the signal increases with increasing Q factor of the WGMs and the optical power of the generated signal and idler. The pumping threshold of the oscillation can be as small as microWatt levels for the resonators with ultrahigh Q-factors.

There are several problems hindering the direct applications of the hyperparametric oscillations. One of those problems is related to the fact that the optical signal escaping WGM resonator is mostly phase modulated. Therefore, a direct detection of the signal on the fast photodiode does not result in generation of a microwave. To go around this discrepancy, the nonlinear WGM resonator can be placed in an arm of a Mach-Zehnder interferometer with an additional delay line in another arm of the interferometer. The optical interference of the light from the two arms allows transforming phase modulated signal into an amplitude modulated signal which can be detected by an optical detector to produce a microwave signal.

Figure 6:
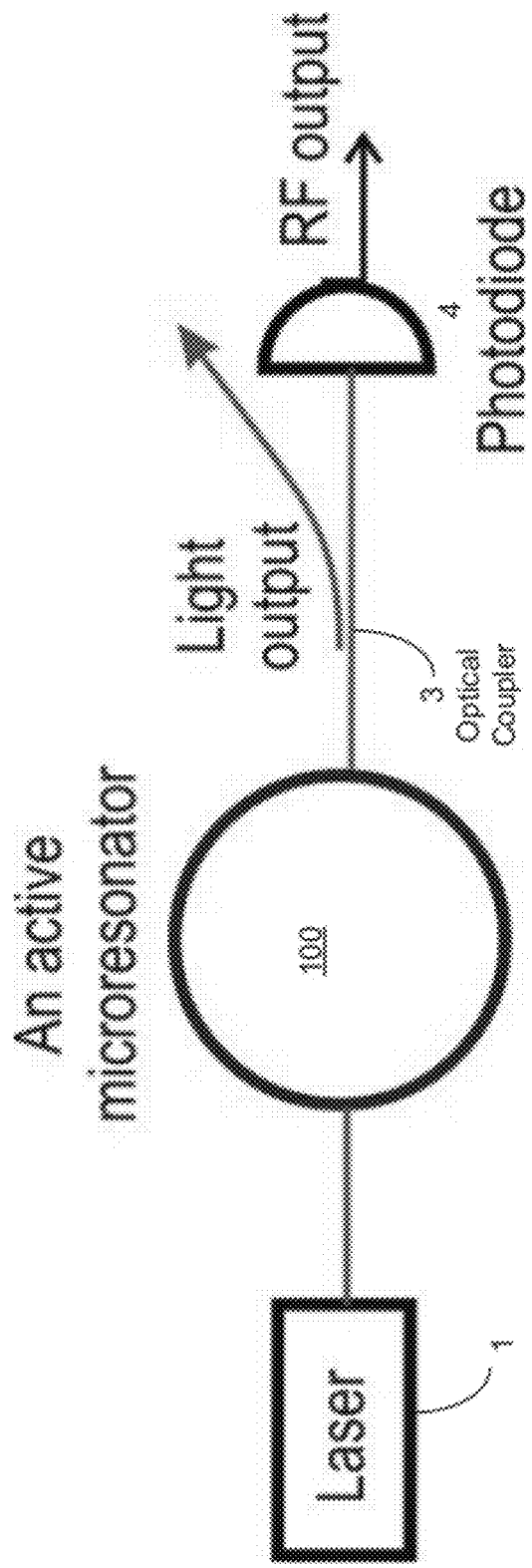
FIG. 6 shows an RF oscillator based on a nonlinear WGM resonator without an OEO loop.

FIG. 6 shows an example of a nonlinear WGM resonator in a RF photonic oscillator. A laser 1 is used to direct laser light into the nonlinear WGM resonator 100. An optical coupler 3 is used to split the output light from the WGM resonator 100 into an optical output of the device and another beam to a photodiode 4 for generating the RF output of the device. There is no external RF loop in this particular RF oscillator. The oscillator generates several optical harmonics within the active optical microresonator. The RF signal is generated by demodulating the harmonics on the fast photodiode 4. Such a device can be used to construct various devices such as a hyper-parametric oscillator, a mode-locked (Raman) laser, an opto-mechanical oscillator, a strongly-nondegenerate RF-optical parametric oscillator, etc. These devices generate optical harmonics with frequencies slightly different from the frequency of the optical pump, by taking energy from the optical pump. The demodulated optical signal becomes a source of stable RF signal.

Figure 7:
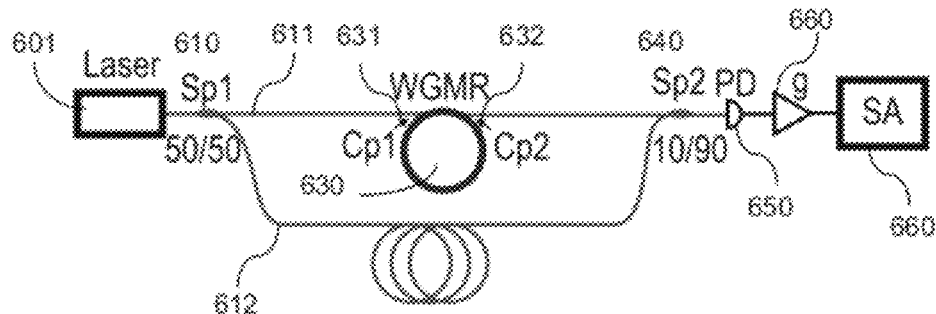
FIGS. 7, 8 and 9 show examples of RF or microwave oscillators based on nonlinear WGM resonators.

FIG. 7 shows an example of a hyperparametric microwave photonic oscillator in an optical interferometer configuration with a first optical path 1611 having the nonlinear WGM resonator 630 and a second optical path 612 with a long delay line. Light from a laser 601 is split into the two paths 611 and 612. Two coupling prisms 631 and 632 or other optical couplers can be used to optically couple the resonator 630 to the first optical path 611. The output light of the resonator 630 is collected into a single-mode fiber after the coupling prism 632 and is combined with the light from the optical delay line. The combined light is sent to a photodiode PD 650 which produces a beat signal as a narrow-band microwave signal with low noise. A signal amplifier 660 and a spectrum analyzer 660 can be used downstream from the photodiode 650.

Figure 8:
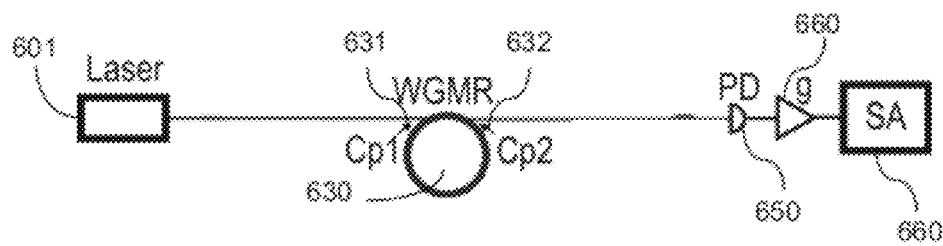

FIG. 8 shows an example of a hyperparametric microwave photonic oscillator in which the oscillator is able to generate microwave signals without a delay in the above interferometer configuration in FIG. 7. This simplifies packaging the device.

Figure 9:
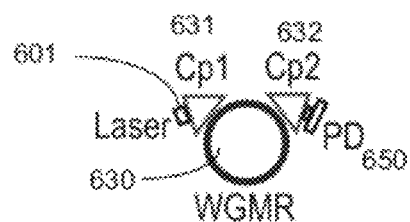

FIG. 9 shows an oscillator where a laser diode 601 is directly coupled to an optical coupling element CP1 (631, e.g., a coupling prism) that is optically coupled to the WDM nonlinear resonator 630 and a second optical coupling element CP2 (632, e.g., a coupling prism) is coupled to the resonator 630 to produce an optical output. The photodiode PD 650 is coupled to the CP2 to convert the optical output received by the photodiode 650 into a low noise RF/microwave signal.

The above designs without the optical delay line or OEO loops can be based on single sideband four wave mixing process occurring in the resonators. A single sideband signal does not require any interferometric technique to generate a microwave signal on the photodiode.

The hyperparametric oscillator produces a high spectral purity for the microwave signal generated at the output of the photodetector. We have measured phase noise of the signals and found that it is shot noise limited and that the phase noise floor can reach at least −126 dBc/Hz level. To improve the spectral purity we can oversaturate the oscillator and generate an optical comb. Microwave signals generated by demodulation of the optical comb have better spectral purity compared with the single-sideband oscillator. Optical comb corresponds to mode locking in the system resulting in phase locked optical harmonics and generation of short optical pulses. We have found that the phase noise of the microwave signal generated by the demodulation of the train of optical pulses with duration t and repetition rate T is given by shot noise with a power spectral density given by $$S_\phi(\omega) \approx \frac{2\hbar\omega_0}{P_{ave}\omega^2} \frac{4\pi^2\alpha t^2}{T^4}$$

where ω0 is the frequency of the optical pump, $P_{ave}$ is the averaged optical power of the generated pulse train, α is the round trip optical loss. Hence, the shorter is the pulse compared with the repetition rate the smaller is the phase noise. On the other hand we know that T/t is approximately the number of modes in the comb N. Hence, we expect that the comb will have much lower (N^2) phase noise compared with usual hyperparametric oscillator having one or two sidebands.

Nonlinear WGM resonators with the third order nonlinearities, such as CaF2 WGM resonators, can be used to construct tunable optical comb generators. A CaF2 WGM resonator was used to generate optical combs with 25 m GHz frequency spacing (m is an integer number). The spacing (the number m) was changed controllably by selecting the proper detuning of the carrier frequency of the pump laser with respect to a selected WGM frequency. Demodulation of the optical comb by means of a fast photodiode can be used to generate high-frequency microwave signals at the comb repetition frequency or the comb spacing. The linewidth of generated 25 GHz signals was less than 40 Hz.

Such a comb generator includes a laser to produce the pump laser beam, a nonlinear WGM resonator and an optical coupling module to couple the pump laser beam into the nonlinear WGM resonator and to couple light out of the nonlinear WGM resonator. Tuning of the frequencies in the optical comb can be achieved by tuning the frequency of the pump laser beam and the comb spacing can be adjusted by locking the pump laser to the nonlinear WGM resonator and controlling the locking condition of the pump laser.

When the WGM resonator is optically pumped at a low input level when the pumping power approaches the threshold of the hyperparametric oscillations, no optical comb is generated and a competition of stimulated Raman scattering (SRS) and the FWM processes is observed. The WGM resonator used in our tests had multiple mode families of high Q WGMs. We found that SRS has a lower threshold compared with the FWM oscillation process in the case of direct pumping of the modes that belong to the basic mode sequence. This is an unexpected result because the SRS process has a somewhat smaller threshold compared with the hyperparametric oscillation in the modes having identical parameters. The discrepancy is due to the fact that different mode families have different quality factors given by the field distribution in the mode, and positions of the couplers. The test setup was arranged in such a way that the basic sequence of the WGMs had lower Q factor (higher loading) compared with the higher order transverse modes. The SRS process starts in the higher-Q modes even though the modes have larger volume V. This happens because the SRS threshold power is inversely proportional to $VQ^2$.

Figure 10:
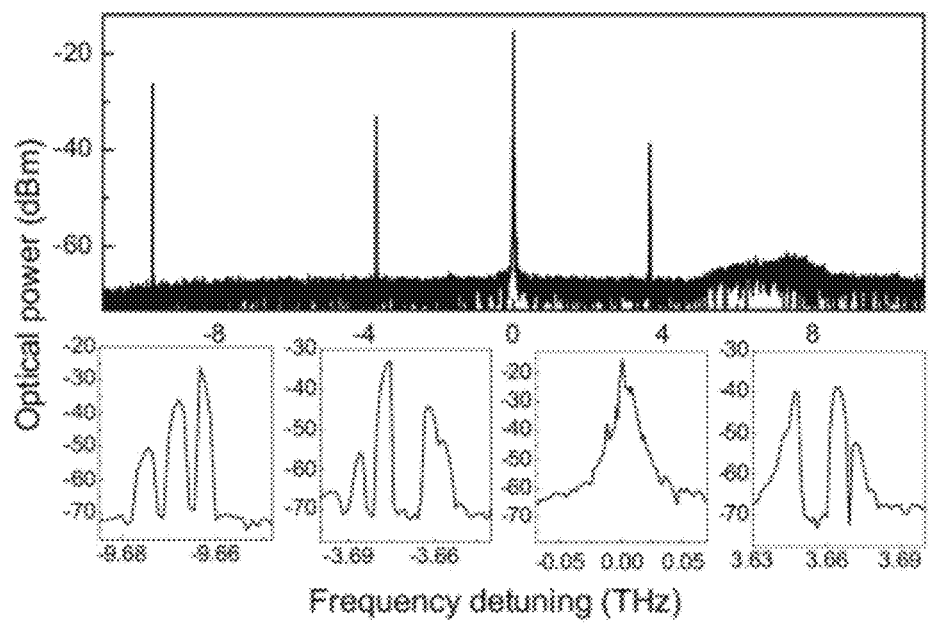
FIGS. 10-15 show measurements of sample nonlinear WGM resonators for generating optical comb signals.

Pumping of the basic mode sequence with larger power of light typically leads to hyperparametric oscillation taking place along with the SRS. FIG. 10 shows a measured frequency spectrum of the SRS at about 9.67 THz from the optical carrier and hyperparametric oscillations observed in the CaF2 resonator pumped to a mode belonging to the basic mode sequence. The structure of the lines is shown by inserts below the spectrum. The loaded quality factor Q was $10^9$ and the pump power sent to the modes was 8 mW. Our tests indicated that hyperparametric and SRS processes start in the higher Q modes. The frequency separation between the modes participating in these processes is much less than the FSR of the resonator and the modes are apparently of transverse nature. This also explains the absence of FWM between the SRS light and the carrier.

The photon pairs generated by FWM are approximately 8 THz apart from the pump frequency as shown in FIG. 10. This is because the CaF2 has its zero-dispersion point in the vicinity of 1550 nm. This generation of photon pairs far away from the pump makes the WGM resonator-based hyperparametric oscillator well suited for quantum communication and quantum cryptography networks. The oscillator avoids large coupling losses occurring when the photon pairs are launched into communication fibers, in contrast with the traditional twin-photon sources based on the $\chi(2)$ down-conversion process. Moreover, a lossless separation of the narrow band photons with their carrier frequencies several terahertz apart can be readily obtained.

In the tests conducted, optical combs were generated when the pump power increased far above the oscillation threshold. Stable optical combs were generated when the frequency of the laser was locked to a high Q transverse WGM. In this way, we observed hyperparametric oscillation with a lower threshold compared with the SRS process. Even a significant increase of the optical pump power did not lead to the onset of the SRS process because of the fast growth of the optical comb lines.

Figure 11:
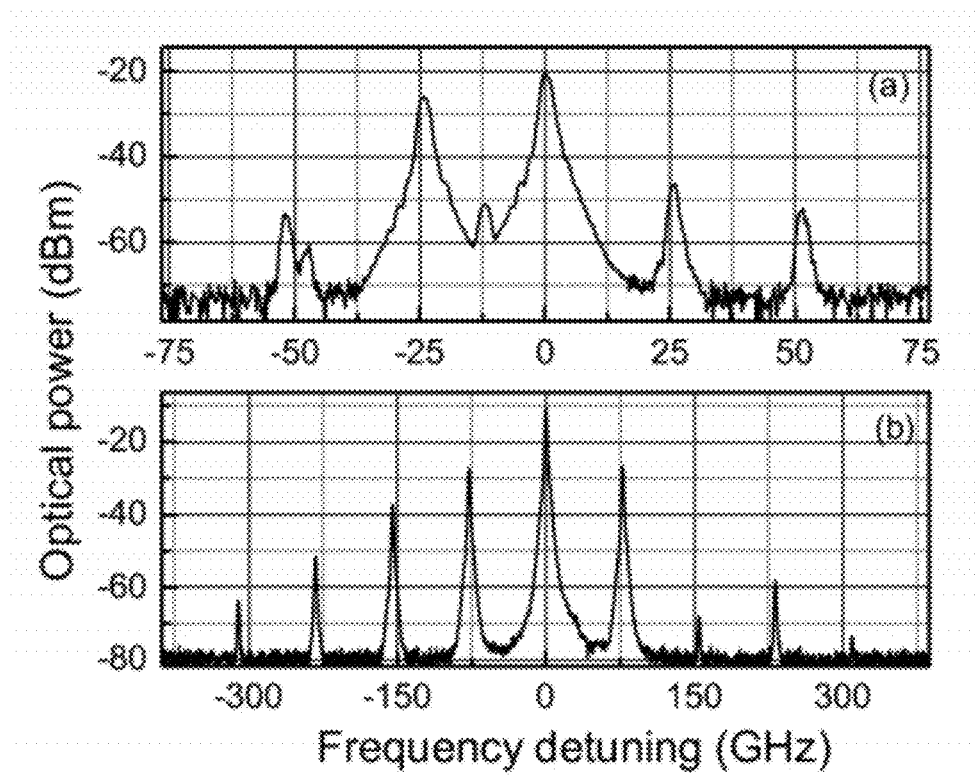

FIG. 11 shows examples of hyperparametric oscillation observed in the resonator pumped with 10 mW of 1550 nm light. Spectra (a) and (b) correspond to different detuning of the pump from the WGM resonant frequency. The measured spectrum (a) shows the result of the photon summation process when the carrier and the first Stokes sideband, separated by 25 GHz, generate photons at 12.5 GHz frequency. The process is possible because of the high density of the WGMs and is forbidden in the single mode family resonators.

The growth of the combs has several peculiarities. In some cases, a significant asymmetry was present in the growth of the signal and idler sidebands as shown in FIG. 11. This asymmetry is not explained with the usual theory of hyperparametric oscillation which predicts generation of symmetric sidebands. One possible explanation for this is the high modal density of the resonator. In the experiment the laser pumps not a single mode, but a nearly degenerate mode cluster. The transverse mode families have slightly different geometrical dispersion so the shape of the cluster changes with frequency and each mode family results in its own hyperparametric oscillation. The signal and idler modes of those oscillations are nearly degenerate so they can interfere, and interference results in sideband suppression on either side of the carrier. This results in the "single sideband" oscillations that were observed in our tests. The interfering combs should not be considered as independent because the generated sidebands have a distinct phase dependence, as is shown in generation of microwave signals by comb demodulation.

Figure 12:
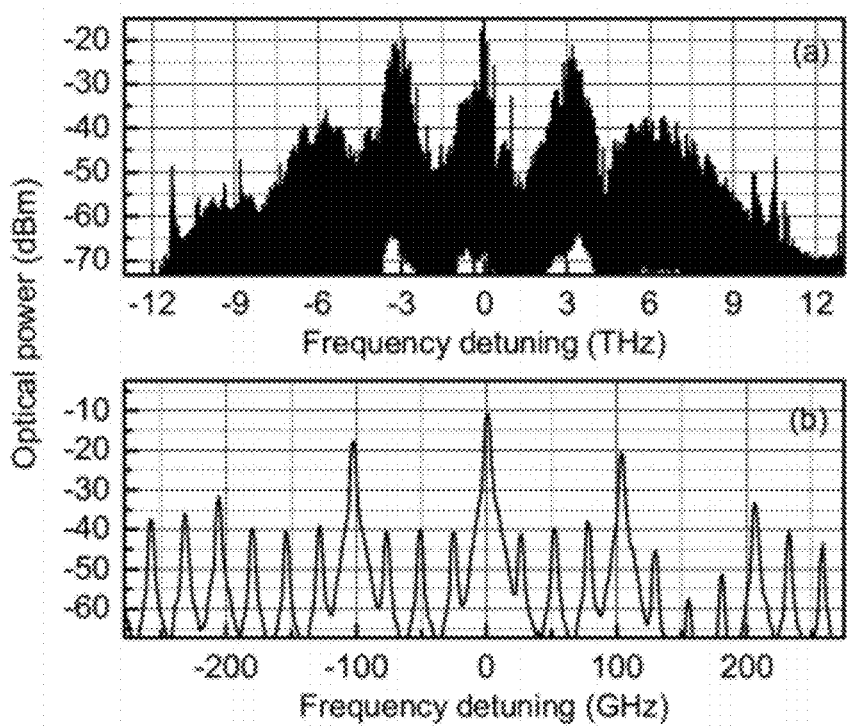
Figure 13:
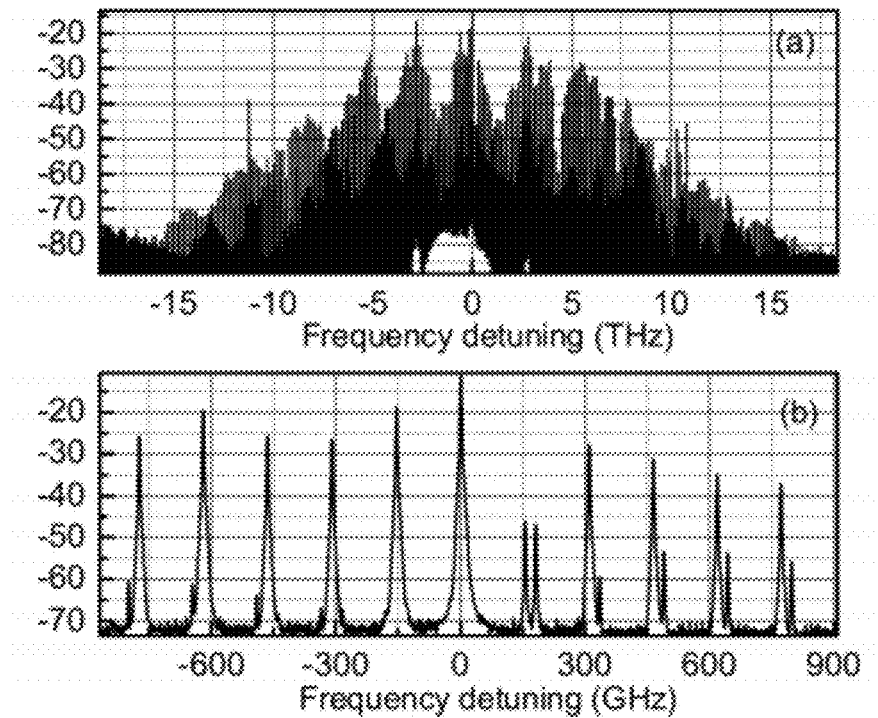

FIG. 12 shows (a) the optical comb generated by the CaF2 WGM resonator pumped at by a pump laser beam of 50 mW in power, and (b) the enlarged central part of the measurement in (a). The generated optical comb has two definite repetition frequencies equal to one and four FSRs of the resonator. FIG. 13 shows the modification of the comb shown in FIG. 12 when the level and the phase of the laser lock were changed. FIG. 13(b) shows the enlarged central part of the measurement in FIG. 13(a).

The interaction of the signal and the idler harmonics becomes more pronounced when the pump power is further increased beyond the pump threshold at which the single sideband oscillation is generated. FIGS. 12 and 13 show observed combs with more than 30 THz frequency span. The envelopes of the combs are modulated and the reason for the modulation can be deduced from FIG. 13(b). The comb is generated over a mode cluster that changes its shape with frequency.

The above described nonlinear WGM resonator-based optical comb generator can be tuned and the controllable tuning of the comb repetition frequency is achieved by changing the frequency of the pump laser. Keeping other experimental conditions unchanged (e.g., the temperature and optical coupling of the resonator), the level and the phase of the laser lock can be changed to cause a change in the comb frequency spacing. The measurements shown in FIGS. 11-13 provide examples for the tuning. This tuning capability of nonlinear WGM resonator-based comb generators is useful in various applications.

Figure 14:
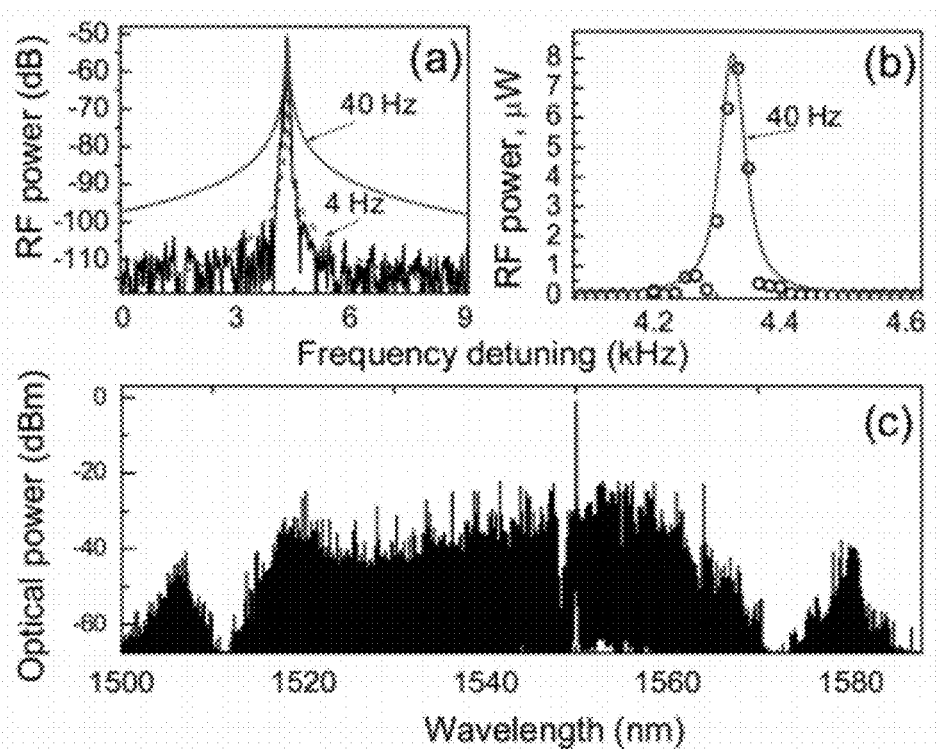

Another feature of nonlinear WGM resonator-based comb generators is that the different modes of the optical comb are coherent. The demodulation of the Kerr (hyperparametric) frequency comb so generated can be directly detected by a fast photodiode to produce a high frequency RF or microwave signal at the comb repetition frequency. This is a consequence and an indication that the comb lines are coherent. The spectral purity of the signal increases with increasing Q factor of the WGMs, the optical power of the generated sidebands, and the spectral width of the comb. The output of the fast photodiode is an RF or microwave beat signal caused by coherent interference between different spectral components in the comb. To demonstrate the coherent properties of the comb, a comb with the primary frequency spacing of 25 GHz was directed into a fast 40-GHz photodiode with an optical band of 1480-1640 nm. FIG. 14 shows the recorded the microwave beat signal output by the 40-GHz photodiode. FIG. 14(a) shows the signal in the logarithmic scale and FIG. 14(b) shows the same signal in the linear scale. FIG. 14(c) shows the spectrum of the optical comb directed into the 40-GHz photodiode. The result of the linear fit of the microwave line indicates that the generated microwave beat signal has a linewidth less than 40 Hz, indicating high coherence of the beat signal. A microwave spectrum analyzer (Agilent 8564A) used in this experiment has a 10 Hz video bandwidth, no averaging, and the internal microwave attenuation is 10 dB (the actual microwave noise floor is an order of magnitude lower). No optical postfiltering of the optical signal was involved.

FIG. 14 also indicates that the microwave signal is inhomogeneously broadened to 40 Hz. The noise floor corresponds to the measurement bandwidth (approximately 4 Hz). The broadening comes from the thermorefractive jitter of the WGM resonance frequency with respect to the pump laser carrier frequency. The laser locking circuit based on 8-kHz modulation used in the test is not fast enough to compensate for this jitter. A faster lock (e.g., 10 MHz) may be used to allow measuring a narrower bandwidth of the microwave signal.

The comb used in the microwave generation in FIG. 14(c) has an asymmetric shape. Unlike the nearly symmetric combs in FIGS. 12 and 13, this comb is shifted to the blue side of the carrier. To produce the comb in FIG. 14(c), the laser was locked to one of the modes belonging to the basic mode sequence. We observed the two mode oscillation process as in FIG. 10 for lower pump power that transformed into the equidistant comb as the pump power was increased. The SRS process was suppressed.

Figure 15:
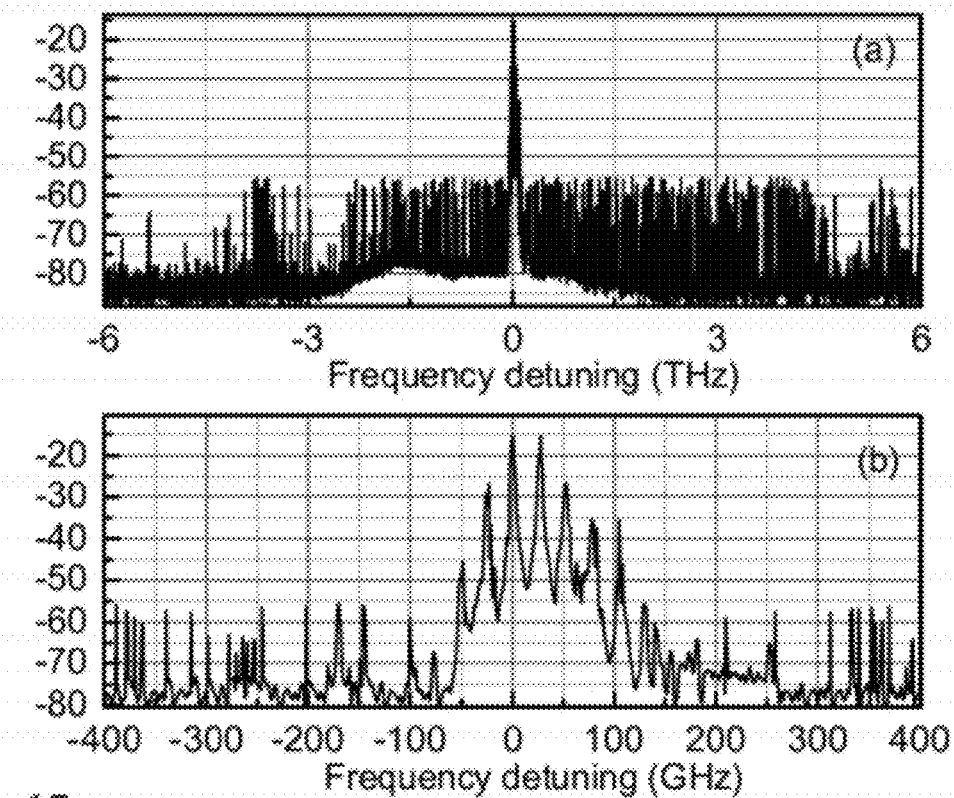

In a different test, an externally modulated light signal was sent to the nonlinear WGM resonator as the optical pump. FIG. 15 shows measured chaotic oscillations measured in the optical output of the nonlinear WGM resonator. The resonator was pumped with laser light at 1550 nm that is modulated at 25 786 kHz and has a power of 50 mW. The generated spectrum is not noticeably broader than the spectrum produced with a cw pumped resonator and the modes are not equidistant.

Therefore, optical frequency combs can be generated by optically pumping a WGM crystalline resonator to provide tunable comb frequency spacing corresponding to the FSR of the resonator. The combs have large spectral widths(e.g., exceeding 30 THz) and good relative coherence of the modes. The properties of the generated combs depend on the selection of the optically pumped mode, and the level and the phase of the lock of the laser to the resonator.

The above described generation of optical combs using optical cubic nonlinearity in WGM resonators can use laser locking to stabilize the frequencies of the generated optical comb signals. A Pound-Drever-Hall (PDH) laser feedback locking scheme can be used to lock the laser that produces the pump light to the nonlinear WGM resonator. The PDH locking is an example of laser locking techniques based on a feedback locking circuit that uses the light coupled of the resonator to produce an electrical control signal to lock the laser to the resonator. The level and the phase of the lock are different for the oscillating and non-oscillating resonators. Increasing the power of the locked laser above the threshold of the oscillation causes the lock instability. This locking of the laser can facilitate generation of spectrally pure microwave signals. Tests indicate that the unlocked comb signals tend to have border linewidths (e.g., about MHz) than linewidths generated by a comb generator with a locked laser, e.g., less than 40 Hz as shown in FIG. 14.

Alternative to the Pound-Drever-Hall (PDH) laser feedback locking, Rayleigh scattering inside a WGM resonator or a solid state ring resonator can be used to lock a laser to such a resonator in a form of self injection locking. This injection locking locks a laser to a nonlinear resonator producing a hyperparametric frequency comb by injecting light of the optical output of the nonlinear resonator under optical pumping by the laser light of the laser back into the laser under a proper phase matching condition. The optical phase of the feedback light from the nonlinear resonator to the laser is adjusted to meet the phase matching condition.

Two feedback mechanisms can be used to direct light from the nonlinear resonator to the laser for locking the laser. The first feedback mechanism uses the signal produced via Rayleigh scattering inside the nonlinear resonator. The light caused by the Rayleigh scattering traces the optical path of the original pump light from the laser to travel from the nonlinear resonator to the laser.

Figure 16:
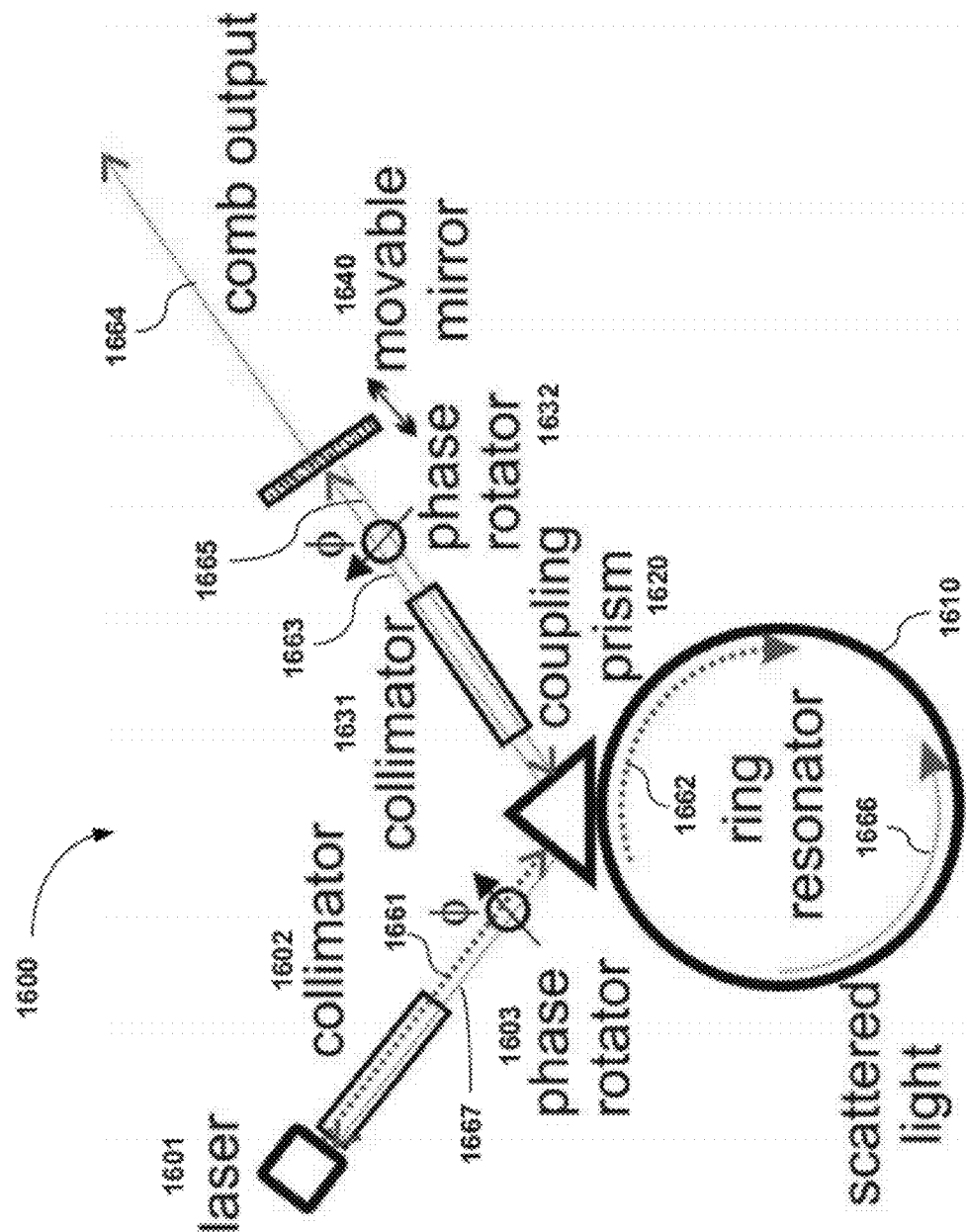
FIG. 16 shows an example for locking a laser to a resonator by using an external reflector.

The second feedback mechanism uses a reflector, e.g., an additional partially transparent mirror, placed at the output optical path of the nonlinear resonator to generate a reflection back to the nonlinear resonator and then to the laser. FIG. 16 shows an example of a device 1600 that locks a laser 1601 to a nonlinear resonator 1610. The nonlinear resonator 1610 can be a ring resonator, a disk resonator, a spherical resonator or non-spherical resonator (e.g., a spheroid resonator). An optical coupler 1620, which can be a coupling prism as shown, is used to provide optical input to the resonator 1610 and to provide optical output from the resonator 1610. The laser 1601 produces and directs a laser beam 1661 to the coupling prism 1620 which couples the laser beam 1661 into the resonator 1610 as the beam 1662 circulating in the counter-clock wise direction inside the resonator 1610. The light of the circulating beam 1662 is optically coupled out by the optical coupler 1620 as a resonator output beam 1663. A reflector 1640 is placed after the coupling prism 1620 in the optical path of the resonator output beam 1663 to reflect at least a portion of the resonator output beam 1663 back to the coupling prism 1620. Optical collimators 1602 and 1631 can be used to collimate the light. The reflector 1640 can be a partial reflector to transmit part of the resonator output beam 1663 as an output beam 1664 and to reflect part of the resonator output beam as a returned beam 1665. The reflector 1640 may also be a full reflector that reflects all light of the beam 1663 back as the returned beam 1665. The feedback beam 1665 is coupled into the resonator 1610 as a counter propagating beam 1666 which is coupled by the coupling prism 1620 as a feedback beam 1667 towards the laser 1601. The feedback beam 1667 enters the laser 1601 and causes the laser to lock to the resonator 1610 via injecting locking.

The above laser locking based on optical feedback from the nonlinear resonator 1610 based on either the Rayleigh scattering inside the resonator 1610 or the external reflector 1640 can be established when the optical phase of the feedback beam 1667 from the resonator 1610 to the laser 1601 meets the phase matching condition for the injection locking. A phase control mechanism can be implemented in the optical path of the feedback beam 1667 in the Rayleigh scattering scheme or one or more beams 1661, 1662, 1663, 1665, 1666 and 1667 in the scheme using the external reflector 1640 to adjust and control the optical phase of the feedback beam 1667. As illustrated, in one implementation of this phase control mechanism, the reflector 1540 may be a movable mirror that can be controlled to change its position along the optical path of the beam 1663 to adjust the optical phase of the feedback beam 1667. The phase of the returning signal 1667 can also be adjusted either by a phase rotator 1603 placed between the laser 1601 and the coupler 1620 or a phase rotator 1663 placed between the coupler 1620 or collimator 1631 and the external reflector or mirror 1640. A joint configuration of using both the Rayleigh scattering inside the resonator 1610 and the external reflector 1640 may also be used. The selection of the configuration depends on the operating conditions including the loading of the resonator 1610 with the coupler 1620 as well as the strength of the Rayleigh scattering in the resonator 1610. Such a locking technique can be used allow avoiding technical difficulties associated with using the PDH locking and other locking designs.

Referring back to FIGS. 1(a) and 1(b), the illustrated device examples can be implemented in planar architectures on semiconductor substrates such as silicon wafers. In some implementations, optical WGM resonators can be monolithically integrated on a substrate in various configurations, e.g., an optical WGM resonator may be integrated on a planar semiconductor structure. The optical WGM resonator may be optical disk or ring resonators integrated on a substrate on which other components of the device are also integrated, including the electronic circuit elements shown in FIGS. 1(*a*) and 1(*b*).

While this document contains many specifics, these should not be construed as limitations on the scope of an invention or of what may be claimed, but rather as descriptions of features specific to particular embodiments of the invention. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

Only a few implementations are disclosed. Variations and enhancements of the described implementations and other implementations can be made based on what is described and illustrated in this document.

What is claimed is:

1. A method for producing a low-noise RF signal based on optical regenerative oscillation from optical nonlinearity in an optical whispering gallery mode resonator, comprising:
    coupling laser light at an optical pump frequency into an optical whispering gallery mode resonator that supports whispering gallery modes and exhibits optical nonlinearity to cause nonlinear optical mixing and parametric amplification by taking energy from the laser light at the optical pump frequency to generate light at one or more new optical frequencies different from the optical pump frequency;
    operating a modulation device that causes a modulation in the laser light based on a radio frequency (RF) signal containing an RF frequency and one or more RF harmonics of the RF frequency and being applied to the modulation device to produce modulated laser light having modulation bands correspond to the RF frequency and the one or more RF harmonics inside the optical whispering gallery mode resonator and to cause nonlinear optical mixing of light in the optical whispering gallery mode resonator at the optical pump frequency and the modulation bands to transfer power from the optical pump frequency to the modulation bands;
    coupling light out of the optical whispering gallery mode resonator into a photodetector to produce an RF detector output at the RF frequency and one or more RF harmonics of the RF frequency based on demodulation at the photodetector of light at the optical pump frequency and the modulation bands;
    directing the RF detector output into an RF circuit that processes the RF signal based on the RF detector output; and
    operating the optical whispering gallery mode resonator, the modulation device, the photodetector and the RF circuit to form an active opto-electronic oscillator loop to sustain an opto-electronic oscillation to sustain the RF signal containing at least some of the RF frequency and the one or more RF harmonics of the RF frequency in the RF circuit and to reduce a phase noise in the RF signal via the nonlinear optical mixing and filtering by the optical whispering gallery mode resonator.

2. The method as in claim 1, wherein the modulation device is an optical modulator outside the optical whispering gallery mode resonator, and the method further includes:
    directing the laser light into the optical modulator to produce modulated laser light; and
    directing modulated laser light output by the optical modulator into the optical whispering gallery mode resonator to cause the nonlinear optical mixing.

3. The method as in claim 1, wherein the optical whispering gallery mode resonator exhibits an opto-electric effect in response to the RF signal, and the modulation device includes at least one electrode formed on the optical whispering gallery mode resonator and coupled to the RF circuit to apply the RF signal to the optical whispering gallery mode resonator to cause optical modulation of the laser light via the opto-electric effect.

4. The method as in claim 1, comprising:
    configuring the RF circuit in the active opto-electronic oscillator loop to effectuate an RF passband that selects the some of the RF frequency and the one or more RF harmonics of the RF frequency while eliminating other RF frequencies.

5. The method as in claim 1, comprising:
    coupling an RF filter in the RF circuit of the active opto-electronic oscillator loop to regulate an optical spectrum of light generated by the nonlinear optical mixing inside the optical whispering gallery mode resonator by the RF circuit's selecting some of the RF frequency and the one or more RF harmonics of the RF frequency while eliminating other RF frequencies.

6. The method as in claim 1, comprising:
    coupling an RF amplifier in the RF circuit of the opto-electronic oscillator loop to amplify the RF signal.

7. The method as in claim 1, comprising:
    coupling a portion of light output by and produced via the nonlinear optical mixing in the optical whispering gallery mode resonator as an optical output that contains light at the optical pump frequency and the optical frequencies corresponding to the modulation bands.

8. The method as in claim 7, comprising:
    operating the active opto-electronic oscillator loop to cause mode locking of optical frequencies in the optical output of the optical whispering gallery mode resonator to produce phase locked optical harmonics and optical pulses.

9. A device for producing a low-noise radio frequency (RF) signal based on regenerating light via optical nonlinearity in an optical whispering gallery mode resonator, comprising:
    a laser that produces laser light at an optical pump frequency;
    an optical whispering gallery mode resonator that supports whispering gallery modes and exhibits optical nonlinearity to cause nonlinear optical mixing and parametric amplification by taking energy from the laser light at the optical pump frequency to generate light at one or more new optical frequencies different from the optical pump frequency;
    an optical coupler that couples the laser light from the laser into the optical whispering gallery mode resonator;
    an optical modulator located in an optical path between the laser and the optical whispering gallery mode resonator, the optical modulator operable to cause a modulation in the laser light based on an RF signal containing an RF frequency and one or more RF harmonics of the RF frequency and being applied to the modulation device to produce modulated laser light having modulation bands correspond to the RF frequency and the one or more RF harmonics, wherein the modulated laser light at the optical pump frequency and the modulation bands inside the optical whispering gallery mode resonator undergo nonlinear optical mixing to transfer power at the optical pump frequency to optical frequencies corresponding to the modulation bands;

a photodetector coupled to receive light coming out of the optical whispering gallery mode resonator to produce an RF detector output at the RF frequency and one or more RF harmonics of the RF frequency based on demodulation at the photodetector of light at the optical pump frequency and the modulation bands; and an RF circuit coupled to receive the RF detector output and operable to process the RF signal based on the RF detector output, wherein the optical modulator, the optical whispering gallery mode resonator, the photodetector and the RF circuit are configured to form an active opto-electronic oscillator loop to sustain an opto-electronic oscillation that sustains the RF signal containing at least some of the RF frequency and the one or more RF harmonics of the RF frequency in the RF circuit and to reduce a phase noise in the RF signal via the nonlinear optical mixing and filtering by the optical whispering gallery mode resonator in the active opto-electronic oscillator loop.

10. The device as in claim 9, wherein:
the RF circuit in the active opto-electronic oscillator loop is configured to effectuate an RF passband that selects the some of the RF frequency and the one or more RF harmonics of the RF frequency to be in the RF signal while eliminating other RF frequencies.

11. The device as in claim 9, wherein:
the RF circuit includes an RF filter to regulate an optical spectrum of light generated by the nonlinear optical mixing inside the optical whispering gallery mode resonator by the RF circuit's selecting some of the RF frequency and the one or more RF harmonics of the RF frequency while eliminating other RF frequencies.

12. The device as in claim 9, wherein:
the RF circuit includes an RF amplifier that amplifies the RF signal.

13. The device as in claim 9, comprising:
an output optical coupler coupling a portion of light output by and produced via the nonlinear optical mixing in the optical whispering gallery mode resonator as an optical output that contains light at the optical pump frequency and the optical frequencies corresponding to the modulation bands.

14. A device for producing a low-noise radio frequency (RF) signal based on regenerating light via optical nonlinearity in an optical whispering gallery mode resonator, comprising:

a laser that produces laser light at an optical pump frequency;

an optical whispering gallery mode resonator that supports whispering gallery modes and exhibits optical nonlinearity to cause nonlinear optical mixing by taking energy from the laser light at the optical pump frequency to generate light at one or more new optical frequencies different from the optical pump frequency, the optical whispering gallery mode resonator exhibiting an opto-electric effect;

an electrode formed on the optical whispering gallery mode resonator to apply a radio frequency (RF) signal containing an RF frequency and one or more RF harmonics of the RF frequency to the optical whispering gallery mode resonator to cause optical modulation of light inside the optical whispering gallery mode resonator via the opto-electric effect;

an optical coupler that couples the laser light from the laser into the optical whispering gallery mode resonator, the laser light coupled inside the optical whispering gallery mode resonator being modulated to include modulation bands corresponding to the RF frequency and the one or more RF harmonics, wherein the modulated laser light at the optical pump frequency and the modulation bands inside the optical whispering gallery mode resonator undergoes the nonlinear optical mixing to transfer power at the optical pump frequency to the modulation bands;

a photodetector coupled to receive light coming out of the optical whispering gallery mode resonator to produce an RF detector output at the RF frequency and one or more RF harmonics of the RF frequency based on demodulation at the photodetector of light at the optical pump frequency and the modulation bands; and an RF circuit coupled to receive the RF detector output and operable to produce the RF signal based on the RF detector output, wherein the RF circuit is coupled to the electrode on the optical whispering gallery mode resonator to apply the RF signal to cause optical modulation inside the optical whispering gallery mode resonator, wherein the optical modulator, the optical whispering gallery mode resonator, the photodetector and the RF circuit are configured to form an active opto-electronic oscillator loop to sustain an opto-electronic oscillation that sustains the RF signal containing at least some of the RF frequency and the one or more RF harmonics of the RF frequency in the RF circuit and to reduce a phase noise in the RF signal via the nonlinear optical mixing and filtering by the optical whispering gallery mode resonator in the active opto-electronic oscillator loop.

15. The device as in claim 14, wherein:
the RF circuit in the active opto-electronic oscillator loop is configured to effectuate an RF passband that selects the some of the RF frequency and the one or more RF harmonics of the RF frequency to be in the RF signal while eliminating other RF frequencies.

16. The device as in claim 14, wherein:
the RF circuit includes an RF filter to regulate an optical spectrum of light generated by the nonlinear optical mixing inside the optical whispering gallery mode resonator by the RF circuit's selecting some of the RF frequency and the one or more RF harmonics of the RF frequency while eliminating other RF frequencies.

17. The device as in claim 14, wherein:
the RF filter includes optical components and electronic components forming a photonic RF filter that performs part of the filtering in the optical domain.

18. The device as in claim 14, wherein:
the RF circuit includes an RF amplifier that amplifies the RF signal.

19. The device as in claim 14, comprising:
an output optical coupler coupling a portion of light output by and produced via the nonlinear optical mixing in the optical whispering gallery mode resonator as an optical output that contains light at the optical pump frequency and the optical frequencies corresponding to the modulation bands.

* * * * *